(12) United States Patent
Iino et al.

(10) Patent No.: US 6,218,769 B1
(45) Date of Patent: Apr. 17, 2001

(54) ULTRASONIC MOTOR AND ELECTRONIC APPARATUS HAVING ULTRASONIC MOTOR

(75) Inventors: Akihiro Iino; Masao Kasuga; Satoshi Watanabe, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/369,089

(22) Filed: Aug. 5, 1999

(30) Foreign Application Priority Data

Aug. 7, 1998 (JP) .................................................. 10-224796
Jul. 22, 1999 (JP) .................................................. 11-207603

(51) Int. Cl.$^7$ .................................................... H01L 41/04
(52) U.S. Cl. ................ 310/328; 310/323.02; 310/323.16
(58) Field of Search ......................... 310/323.02, 323.16, 310/328

(56) References Cited

U.S. PATENT DOCUMENTS

| | | | | |
|---|---|---|---|---|
| 5,345,137 | * | 9/1994 | Funakubo et al. | 310/323 |
| 5,453,653 | * | 9/1995 | Zumeris | 310/323 |
| 5,616,980 | * | 4/1997 | Zumeris | 310/323 |
| 5,682,076 | * | 10/1997 | Zumeris | 310/323 |
| 5,877,579 | * | 3/1999 | Zumeris | 310/317 |

FOREIGN PATENT DOCUMENTS

| | | | |
|---|---|---|---|
| 38 33 342 | * | 5/1990 | (DE) . |
| 2-007875 | * | 6/1988 | (JP) . |
| 2-041673 | * | 7/1988 | (JP) . |

\* cited by examiner

Primary Examiner—Elvin Enad
Assistant Examiner—Peter Medley
(74) Attorney, Agent, or Firm—Adams & Wilks

(57) ABSTRACT

An ultrasonic motor comprises first piezoelectric oscillators alternately arranged with first polarized regions having a first direction of polarization and second polarized regions having a second direction of polarization opposite to the first direction of polarization. The first piezoelectric oscillators undergo bending vibration in a first direction upon input of drive signals having a same phase to the first polarized regions and the second polarized regions to thereby excite the first and second polarized regions. Second piezoelectric oscillators are laminated to the first piezoelectric oscillators in a second direction generally perpendicular to the first direction for undergoing elongation and contraction vibration in the first direction. When a driving signal is applied to the first and second piezoelectric oscillators a drive force is generated by a combination of the bending vibration of the first piezoelectric oscillators and the elongation and contraction vibration of the second piezoelectric oscillators.

18 Claims, 43 Drawing Sheets

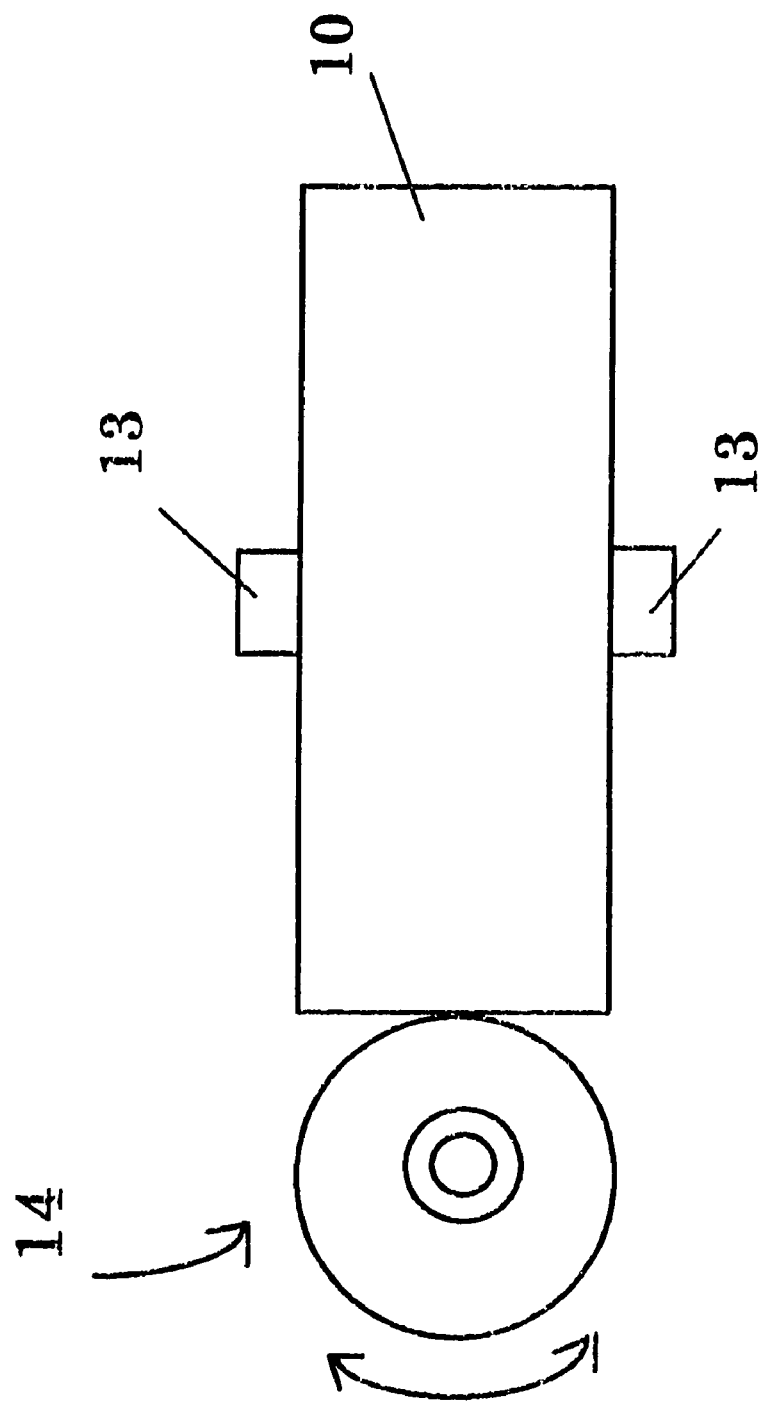

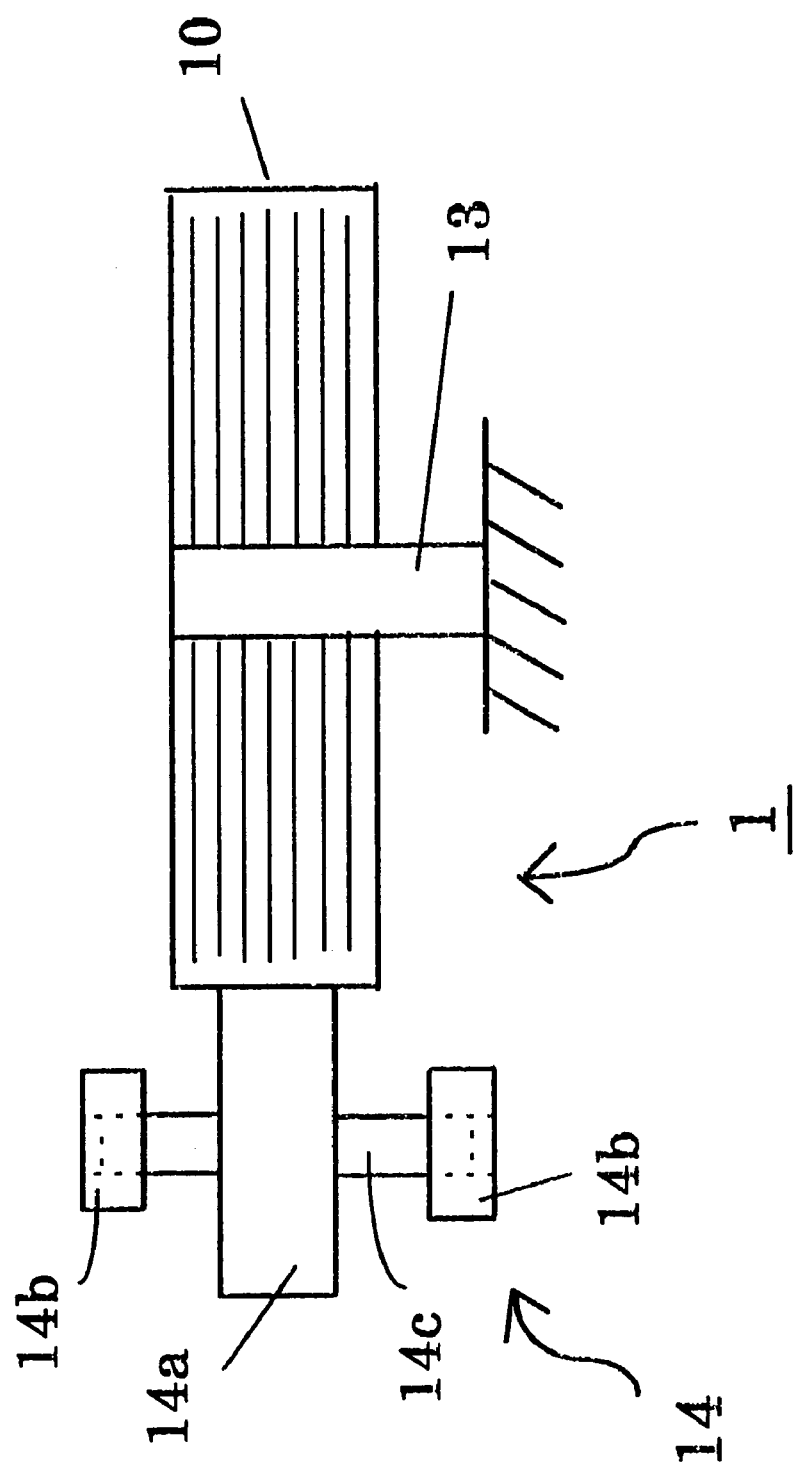

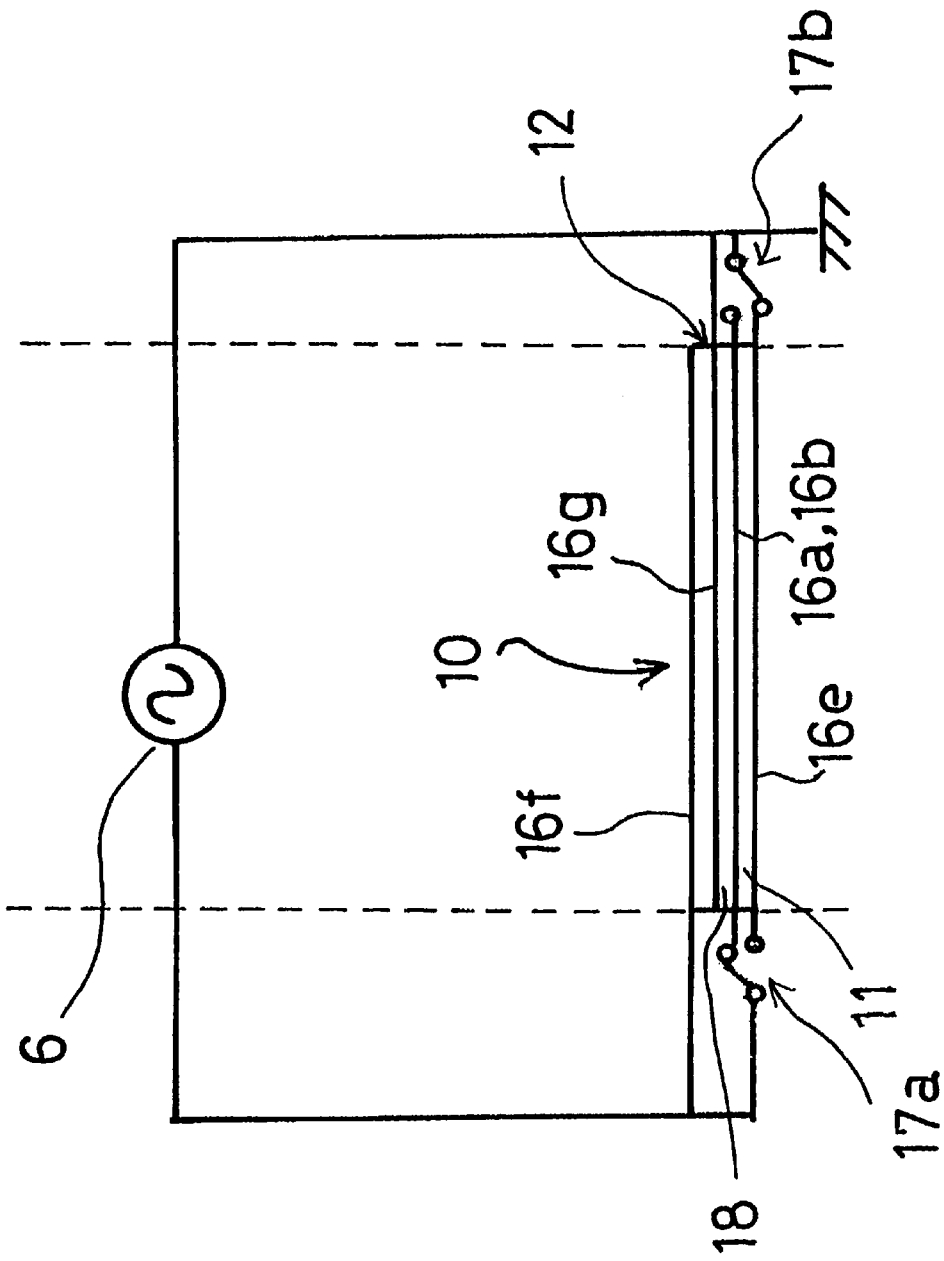

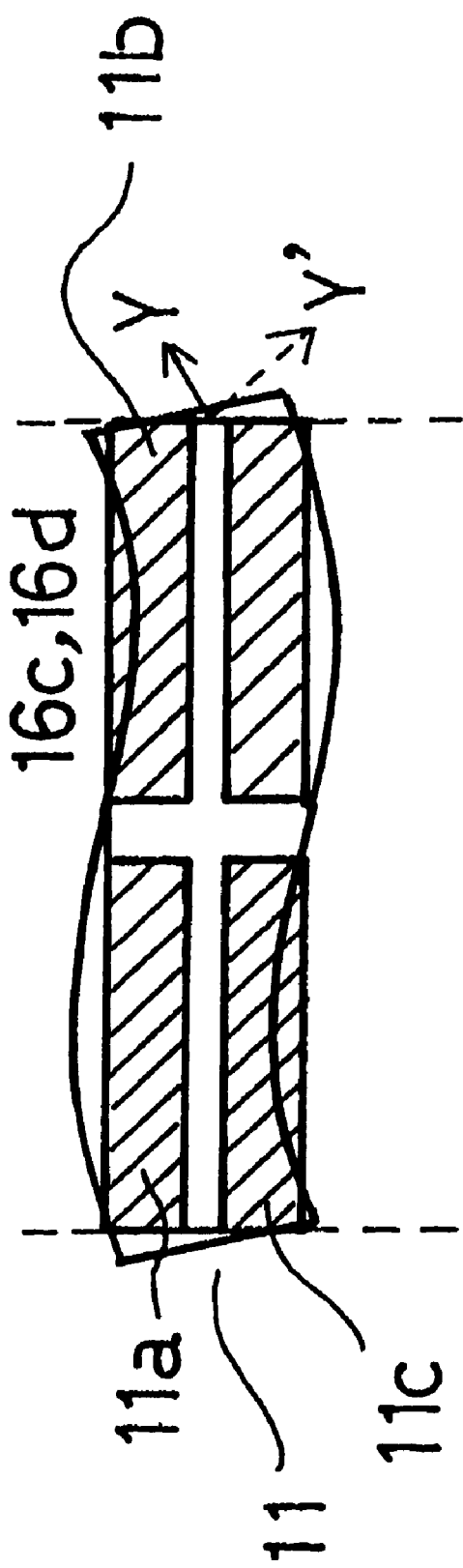

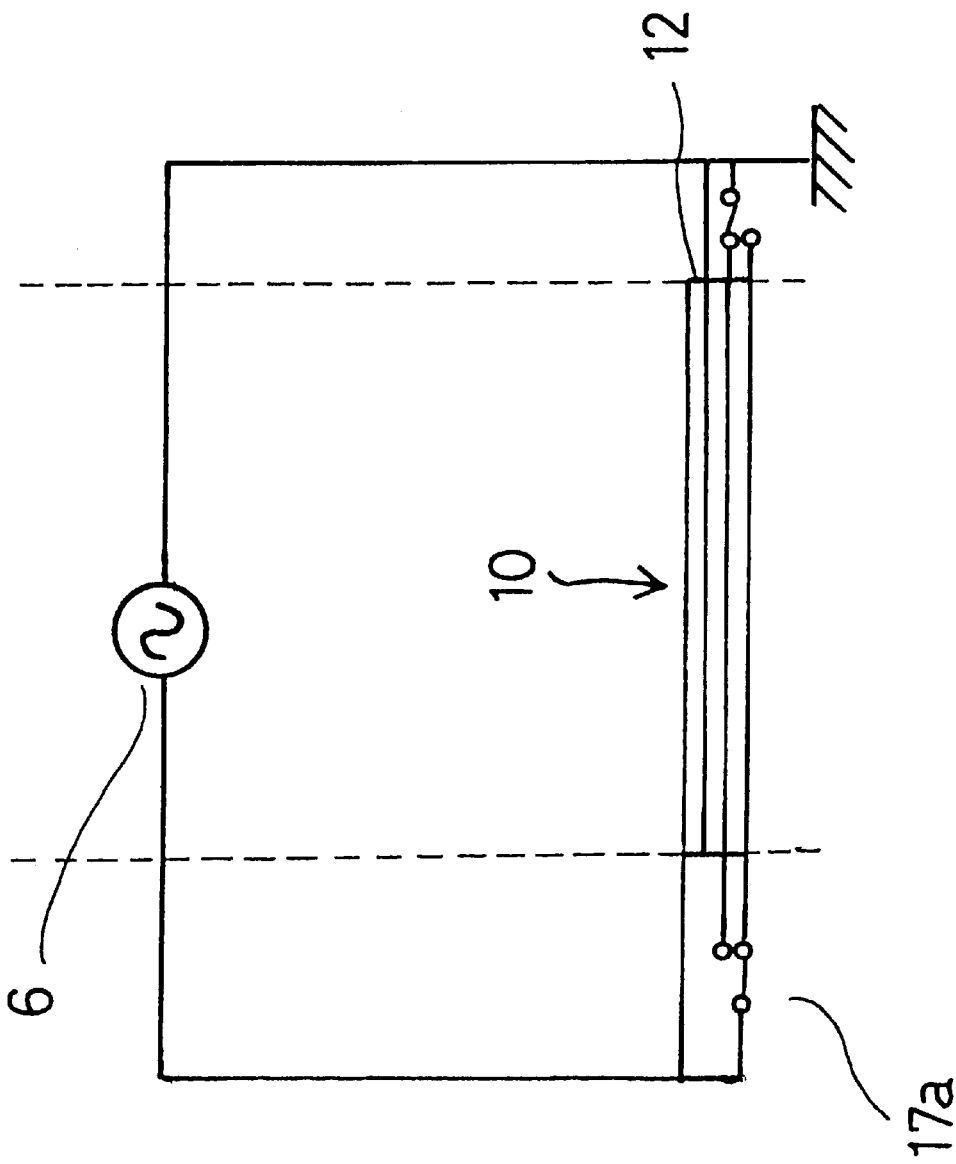

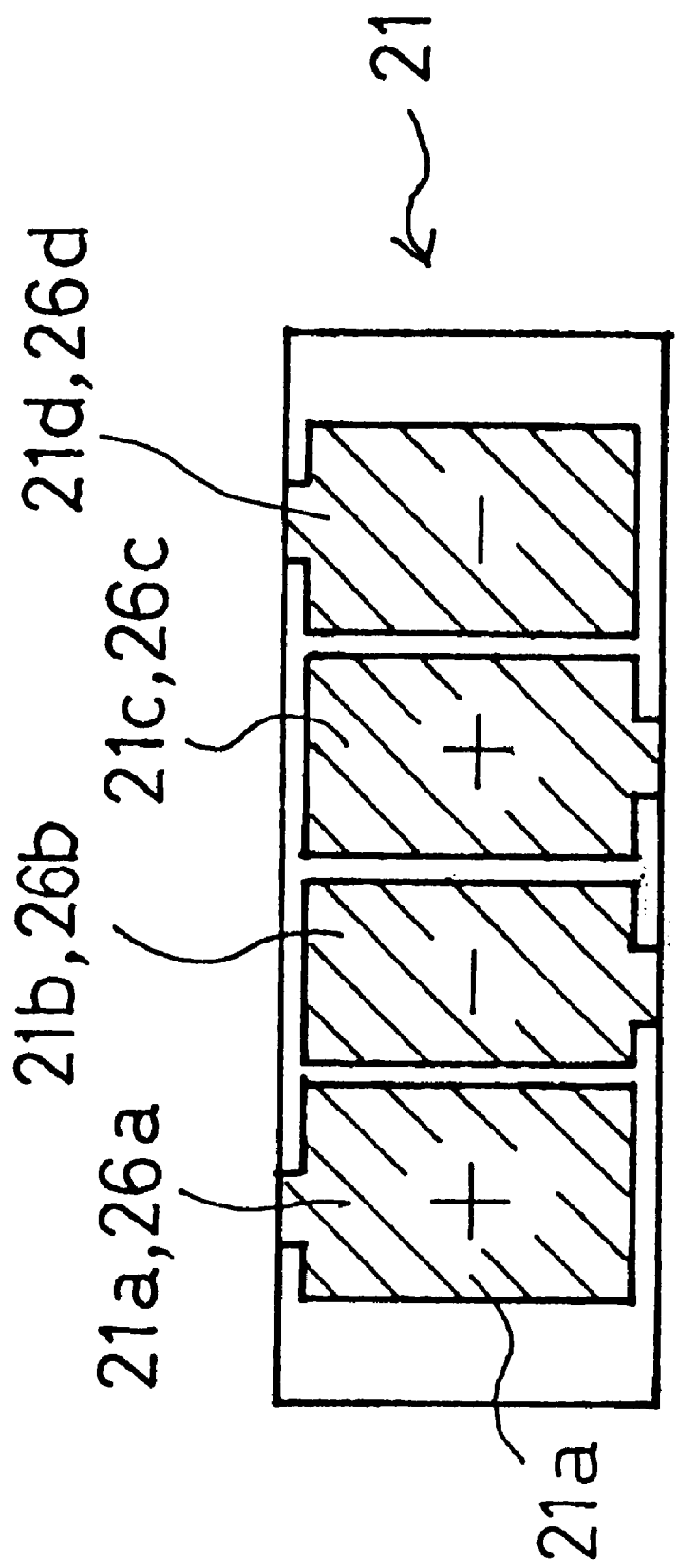

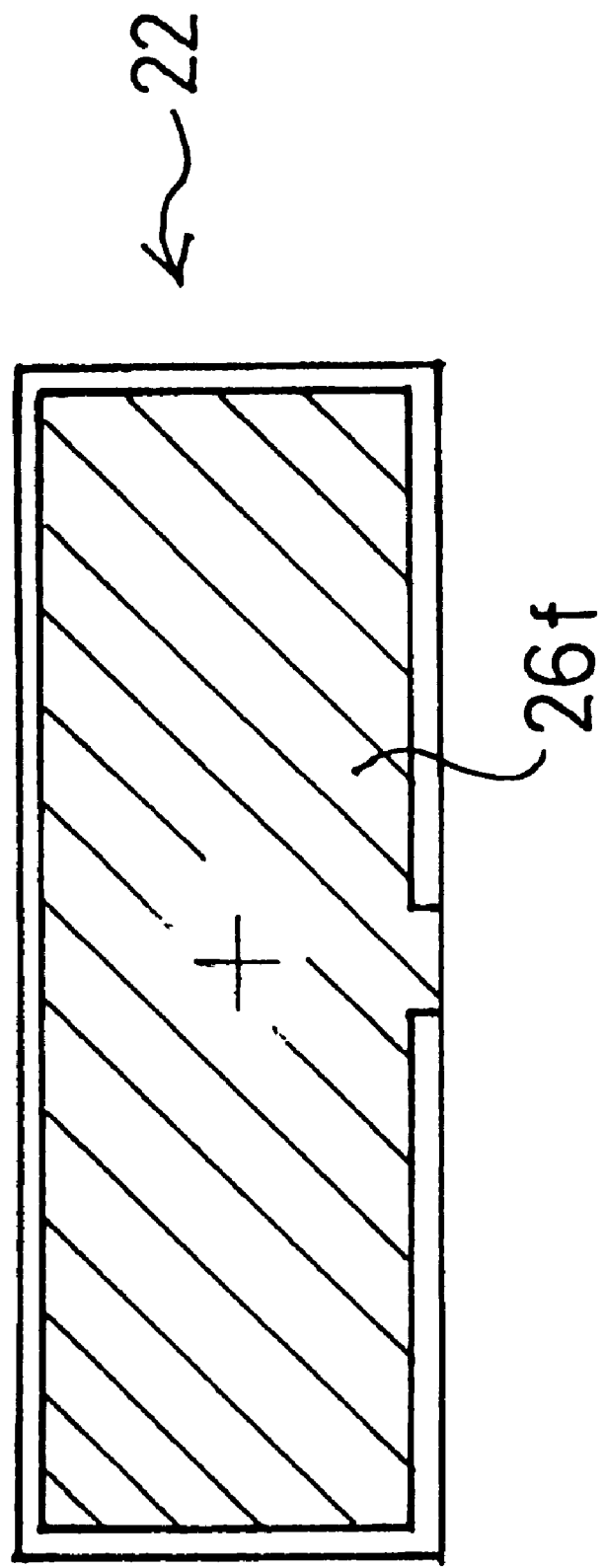

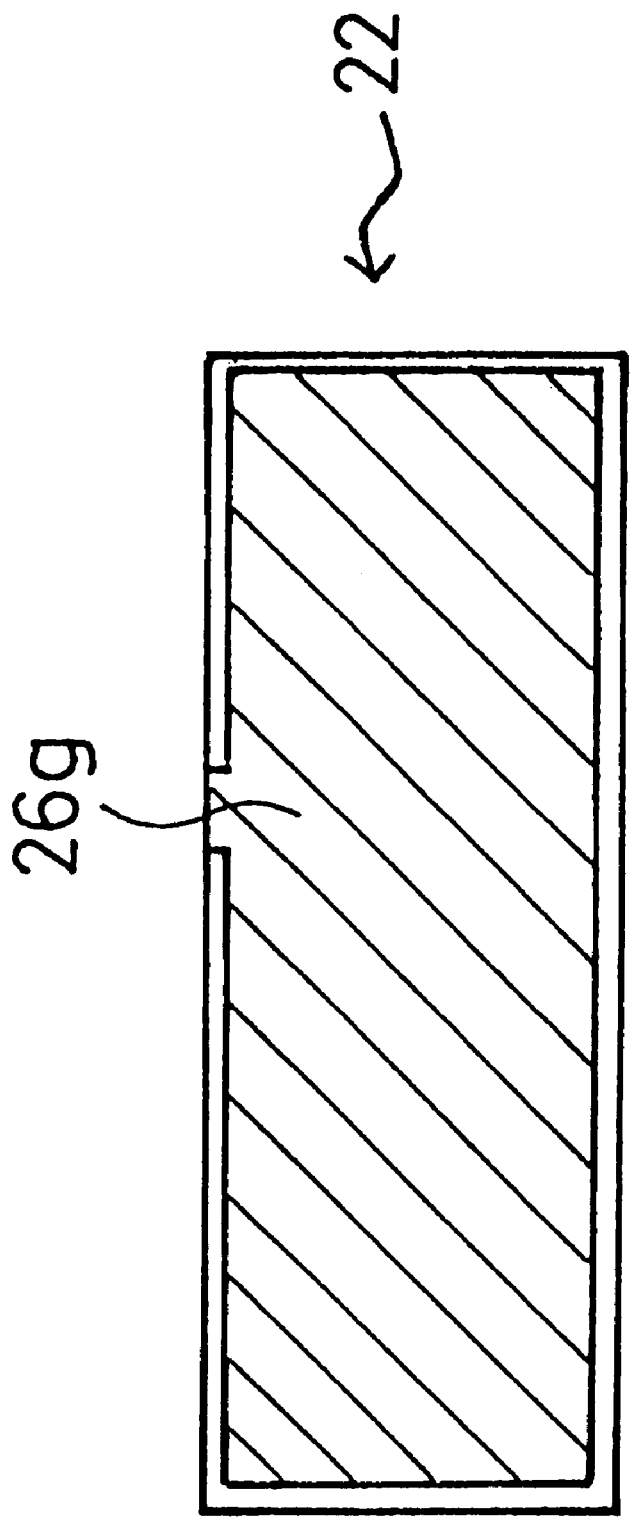

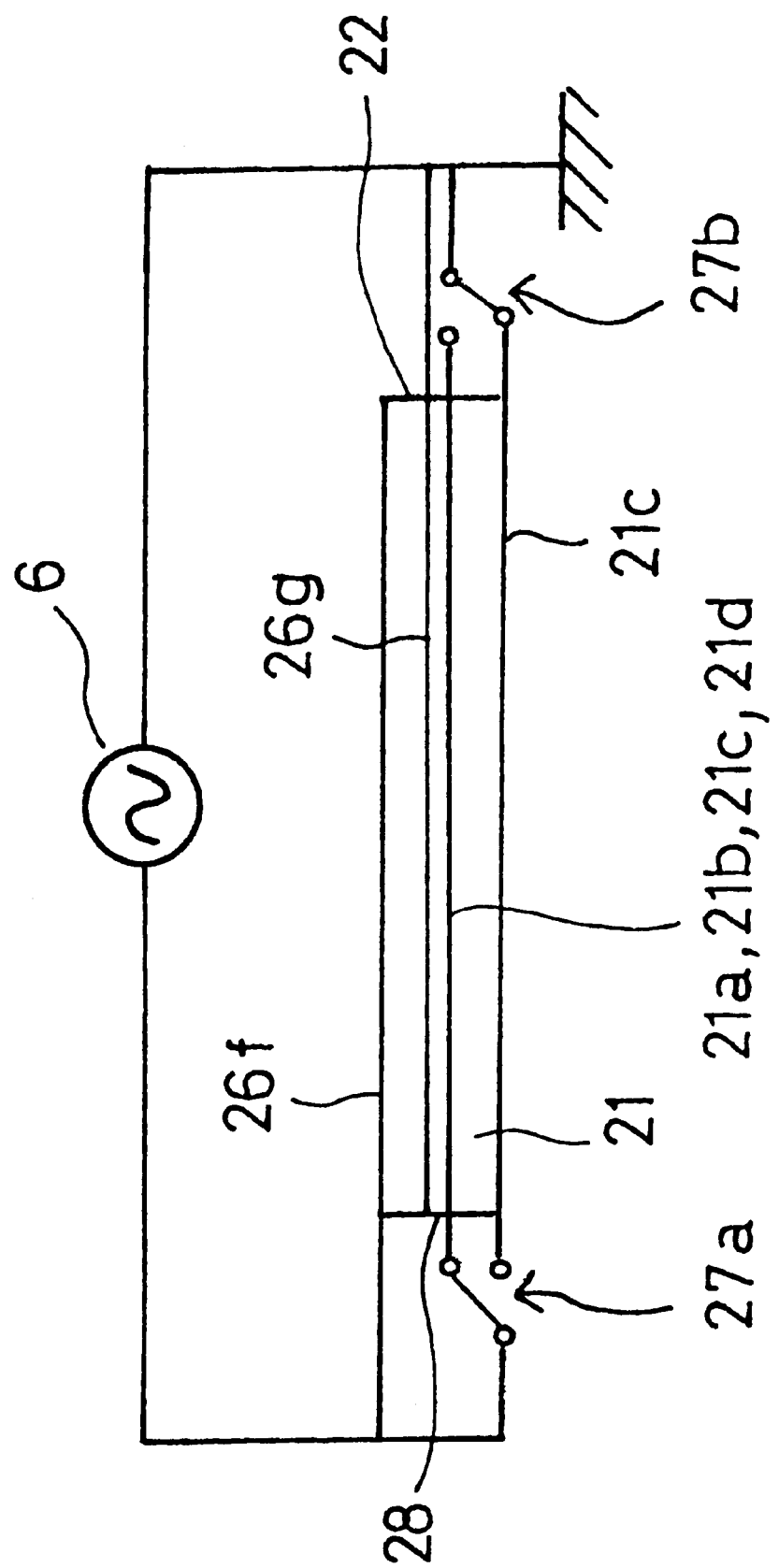

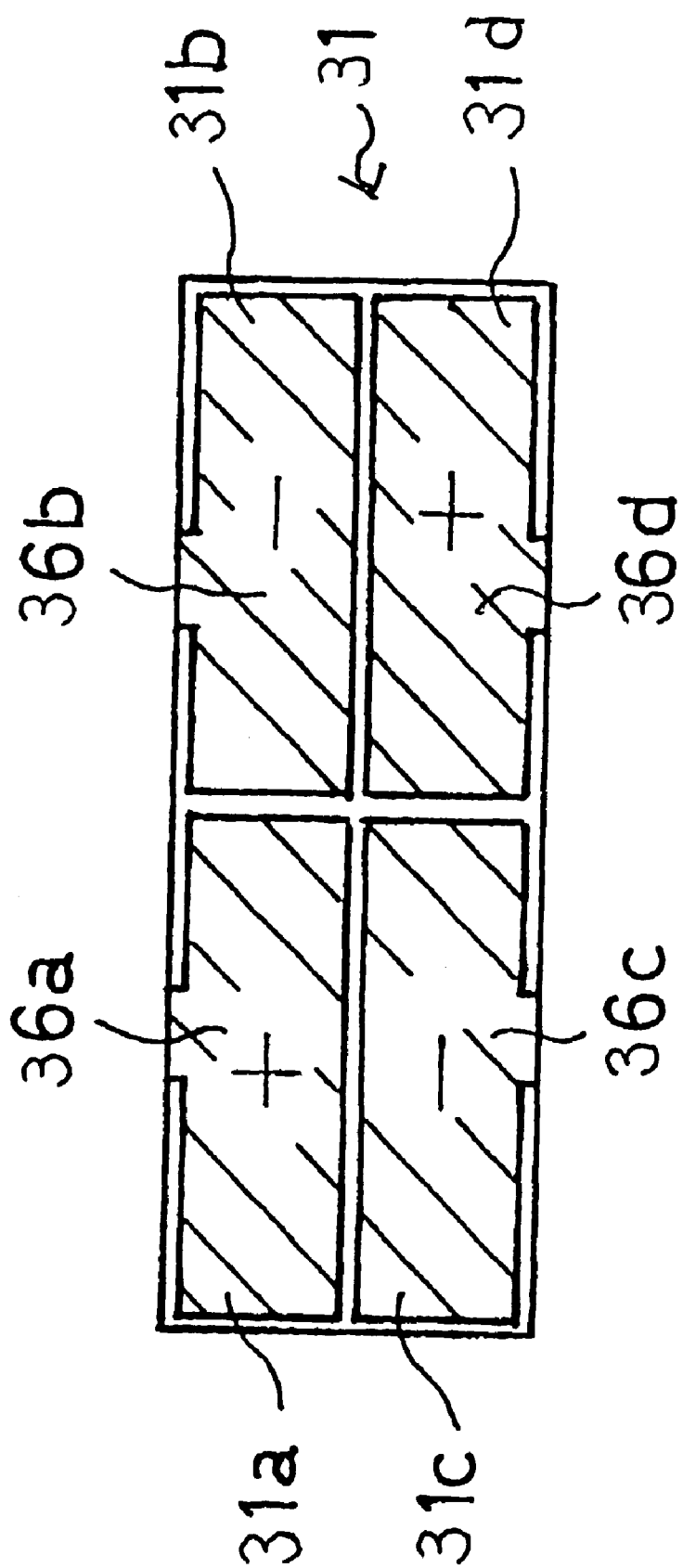

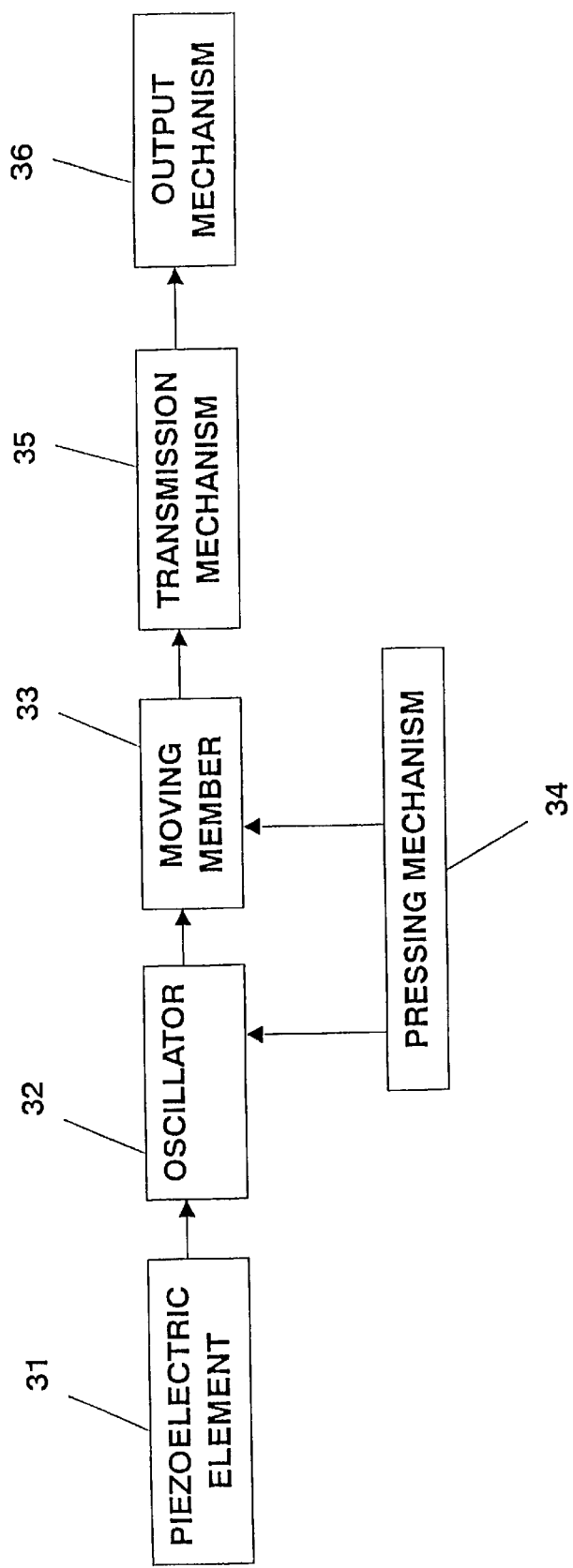

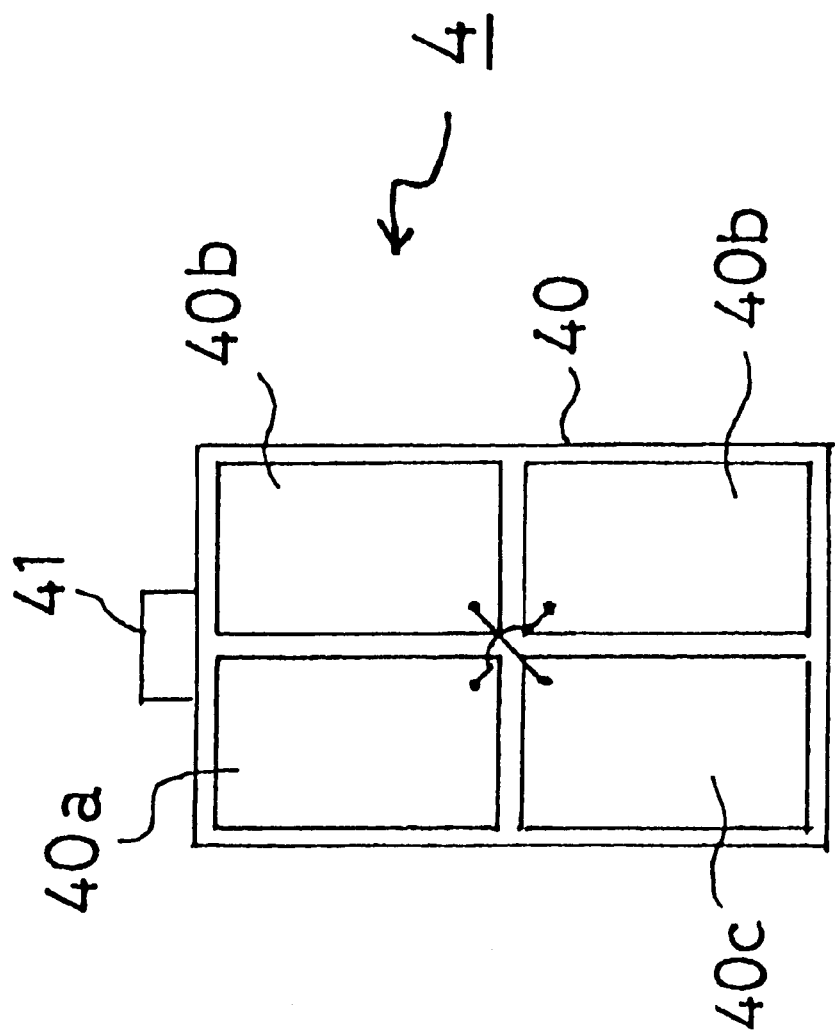

ULTRASONIC MOTOR AND ELECTRONIC APPARATUS HAVING ULTRASONIC MOTOR

BACKGROUND OF THE INVENTION

1. Field of the Invention

The present invention relates to ultrasonic motors used in a timepiece, a camera, a printer, a storage apparatus and so on, and more particularly to an ultrasonic motor with a magnified drive force.

2. Description of the Related Art

In recent times, in the field of micromechanics attention is attracted to a ultrasonic motor utilizing as power, an elliptical motion as synthesized vibration of elongation and contraction vibration and bending vibration produced in a piezoelectric element applied with a drive signal of alternating current voltage or the like.

Here, an explanation will be given of an ultrasonic motor 4 and an ultrasonic motor 5 as conventional ultrasonic motors in reference to FIGS. 13a and 13b.

As shown by FIG. 13a, the ultrasonic motor 4 is provided with the structure installed with a projection 41 for taking out an output for moving a moving body (illustration is omitted) by being brought into press contact with the moving body at one end face of a piezoelectric element 40 in a shape of a rectangular parallelepiped.

In this case, the piezoelectric element 40 is provided with four of a polarized region 40a, a polarized region 40b, a polarized region 40c and a polarized region 40d which are polarized in the same polarities in the thickness direction and arranged in two rows each comprising two pieces thereof. Further, the polarized regions 40a, 40b, 40c and 40d are respectively provided with electrodes. Further, the electrode on the polarized region 40a and the electrode on the polarized region 40d which are diagonally opposedly positioned, are shortcircuited by using a lead wire. Similarly, the electrode on the polarized region 40b and the electrode on the polarized region 40c are shortcircuited by using a lead wire.

The ultrasonic motor 4 moves the moving body in a positive direction by inputting drive signals to the polarized regions 40a and 40d and moves the moving body in a reverse direction by inputting drive signals to the polarized regions 40b and 40c.

The ultrasonic motor 5 is provided with a piezoelectric element 50 shown by FIG. 13b as a power source. The piezoelectric element 50 is provided with four of a polarized region 50a, a polarized region 50b, a polarized region 50c and a polarized region 50d which are polarized in the same polarities in the thickness direction and arranged in two rows each constituting two pieces thereof similar to the piezoelectric element 40. The polarized regions 50a, 50b, 50c and 50d are respectively provided with electrodes insulated from each other.

The ultrasonic motor 5 moves a moving body, not illustrated, in the positive direction by inputting drive signals X having the same phase to the polarized regions 50a and 50d and inputting drive signals having a phase advanced from that of the drive signal X by 90 degree to the polarized regions 50b and 50c. Further, the ultrasonic motor 5 moves the moving body, not illustrated, in the reverse direction by inputting drive signals having a phase retarded from that of the drive signal X by 90 degree to the polarized regions 50b and 50c.

However, the ultrasonic motor 4 utilizes only a half of the polarized regions of the piezoelectric element 40 as the power source and therefore, large output is not provided.

Further, although the ultrasonic motor 5 utilizes all of the polarized regions of the piezoelectric element 50 as a power source, there is needed a circuit for shifting the phase of the input signal by 90 degree. Particularly, when there is carried out self-excited oscillation for driving the ultrasonic motor by utilizing the self-excited oscillation, two input signals having different phases are used and therefore, the constitution of a self-excited oscillation drive circuit becomes complicated and is difficult to realize.

Further, the ultrasonic motor 4 utilizes the piezoelectric element 40 and the ultrasonic motor 5 utilizes the piezoelectric element 50 as both a source of elongation and contraction vibration and a source of bending vibration and accordingly, large elongation and contraction vibration or bending vibration cannot be provided. That is, sufficient output cannot be provided by the conventional ultrasonic motors 4 and 5. Therefore, in order to provide large output by using the ultrasonic motor 4 or 5, as shown by FIG. 14, for example, a plurality of the ultrasonic motors 4 must be arranged in parallel by using an exclusive jig, which hampers downsizing thereof. Also in this case, vibration escapes from the exclusive jig and, therefore, the output of the ultrasonic motor is reduced.

Further, the elongation and contraction vibration and the bending vibration cannot be controlled independently from each other and accordingly, a moving speed and a drive force of the moving body cannot be controlled widely.

SUMMARY OF THE INVENTION

Hence, it is an object of the present invention to provide an ultrasonic motor in which all of polarized regions of piezoelectric elements are simultaneously utilized and are driven by only input signals having the same phase or an inverted phase and both of large elongation and contraction vibration and bending vibration can separately be controlled and which is provided with large output at low voltage and can be downsized.

In order to resolve the above-described problem, according to an aspect of the invention, there is provided an ultrasonic motor comprising first piezoelectric oscillators totally having a plurality of polarized regions alternately arranged with first polarized regions polarized in same polarities and second polarized regions polarized reversely to the first polarized regions and producing a bending vibration by inputting drive signals having a same phase to the first polarized regions and the second polarized regions to thereby excite the first polarized regions. Second the polarized regions and second piezoelectric oscillators laminated integrally to the first piezoelectric oscillators and produce an elongation and contraction vibration by exciting polarized regions polarized in same polarities. A drive force is provided by an elliptic vibration synthesized with the bending vibration produced in the first piezoelectric oscillators and the elongation and contraction vibration produced in the second piezoelectric oscillators.

In this case, for example, barium titanate, lead titanate, lithium niobate, lithium tantalate or the like is used for the piezoelectric oscillator. Further, as the signal having the same phase, for example, a sine wave is used.

According to the invention, the first piezoelectric oscillators are totally and alternately provided with the first polarized regions polarized in the same polarities and the second polarized regions polarized reverse to the first polarized regions and the drive signals having the same phase are inputted to the plurality of polarized regions and accordingly, large bending vibration is produced. Further, the second piezoelectric oscillators constituting the elongation and contraction vibration source which are installed separately from the first piezoelectric oscillators, produce large elongation and contraction vibration. Further, the first piezoelectric oscillators and the second piezoelectric oscillators are integrally formed and accordingly, the bending vibration and the elongation and contraction vibration are synthesized without leakage. Accordingly, the ultrasonic motor having large output can be fabricated.

Therefore, in the case of providing an output the same as that of the conventional motor, the ultrasonic motor can be downsized.

Further, by separately controlling the first piezoelectric oscillators and the second piezoelectric oscillators, the elongation and contraction vibration and the bending vibration can separately be controlled.

Further, according to another aspect of the invention, there is provided the ultrasonic motor wherein the plurality of polarized regions of the first piezoelectric oscillator are arranged in two rows along one direction.

According to the invention, other than achieving operation similar to that in the above-described aspect of the invention, the ultrasonic motor for taking out output from a face in parallel with a laminating direction can be fabricated.

Further, according to another aspect of the invention, there is provided the ultrasonic motor wherein the plurality of polarized regions of the first piezoelectric oscillator are arranged in one row along one direction.

According to the invention, other than achieving operation similar to those in the above-described aspects of the invention, the ultrasonic motor for taking out output from a face orthogonal to the laminating direction can be fabricated and accordingly, an apparatus mounted with the ultrasonic motor can be thinned.

Further, according to another aspect of the invention, there is provided the ultrasonic motor wherein respective pluralities of the first piezoelectric oscillators and the second piezoelectric oscillators are integrally laminated.

In this case, for example, the first piezoelectric oscillators and the second piezoelectric oscillators are alternately laminated. Further, numbers thereof are, for example, four sheets, respectively.

According to the invention, other than achieving operation similar to those in the above-described aspects of the invention, respective pluralities of the first piezoelectric oscillators and the second piezoelectric oscillators are used and accordingly, the output is further magnified. Further, by changing a ratio of numbers of sheets of the first piezoelectric oscillators and the second piezoelectric oscillators, a ratio of magnitudes of the elongation and contraction vibration and the bending vibration can be changed.

Further, according to another aspect of the invention, there is provided the ultrasonic motor wherein the plurality of polarized regions of the first piezoelectric oscillators and the polarized regions of the second piezoelectric oscillators are inputted with drive signals having a same phase from a same signal source.

In this case, an alternating current power source is used as the signal source.

According to the invention, the ultrasonic motor is driven by a single one of an input signal and accordingly, a self-excited oscillation circuit is simplified, therefore, self-excited oscillation drive is easily realized.

Further, the same signal source is used as a signal source of the same phase and accordingly, a peripheral circuit of the ultrasonic motor is simplified.

Further, according to another aspect of the invention, there is provided the ultrasonic motor wherein either of the first piezoelectric oscillators and the second piezoelectric oscillators is connected to a signal source via switching means for inverting the phase of the drive signals.

In this case, for example, switches are used as the switching means.

According to the invention, either of the first piezoelectric oscillators and the second piezoelectric oscillators is connected to the signal source via the switching means for inverting a phase of a signal.

Therefore, by simply switching the switching means, an input signal to either of the first piezoelectric oscillators and the second piezoelectric oscillators is provided with an inverted phase. That is, the drive direction of the ultrasonic motor is reversed.

Further, according to another aspect of the invention, there is provided an electronic apparatus having a ultrasonic motor, the electronic apparatus comprising the ultrasonic motor, described above.

In this case, as the electronic apparatus, there is pointed out, for example, an electronic timepiece, a measuring instrument, a camera, a printer, a printing machine, a machine tool, a robot, a moving apparatus, a storage apparatus or the like.

According to the invention, there is used the ultrasonic motor, described above, having an output larger than that of the conventional ultrasonic motor and therefore, the size of the ultrasonic motor and its peripheral circuit can be downsized whereby the electronic apparatus having the ultrasonic motor can be downsized.

Further, as a drive method of the ultrasonic motor, particularly, self-excited oscillation drive is easily applicable and therefore, the peripheral circuit can further be downsized.

BRIEF DESCRIPTION OF THE DRAWINGS

FIGS. 1a and 1b and 1c are views showing a constitution of anultrasonic motor 1 according to a first embodiment of the invention;

FIGS. 4a, 4b, 4c and 4d are views showing operation of the ultrasonic motor 1;

FIGS. 5a, 5b, 5c and 5d are views showing the operation of the ultrasonic motor 1;

FIGS. 7a, 7b, 7c, 7d, 7e and 7f are views showing structures of a piezoelectric oscillator 21, a piezoelectric oscillator 22 and electrodes 26a, 26b, 26c, 26d, 26e, 26f and 26g used in a piezoelectric element 20 of the ultrasonic motor 2;

FIGS. 9a, 9b, 9c and 9d are views showing the operation of the ultrasonic motor 2;

FIGS. 10a, 10b, 10c, 10d, 10e and 10f are views showing structures of a piezoelectric oscillator 31, a piezoelectric oscillator 32 and electrodes 36a, 36b, 36c, 36d, 36e and 36f used in a piezoelectric element 30;

FIG. 12 is a block diagram showing a constitution of an electronic apparatus 6 having a ultrasonic motor according to a forth embodiment of the invention;

FIGS. 13a and 13b are views showing constitutions of an ultrasonic motor 4 and a ultrasonic motor 5 as conventional examples.

DETAILED DESCRIPTION OF THE PREFERRED EMBODIMENTS

A detailed explanation will be given of embodiments to which the invention is applied in reference to FIGS. 1a through FIG. 12 as follows.

Figure 8A:
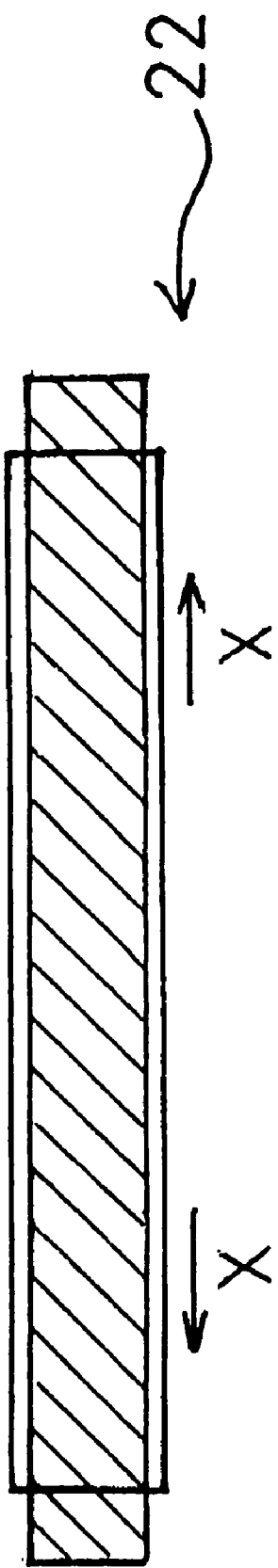
FIGS. 8a, 8b, 8c and 8d are views showing operation of the ultrasonic motor 2.
Figure 8B:
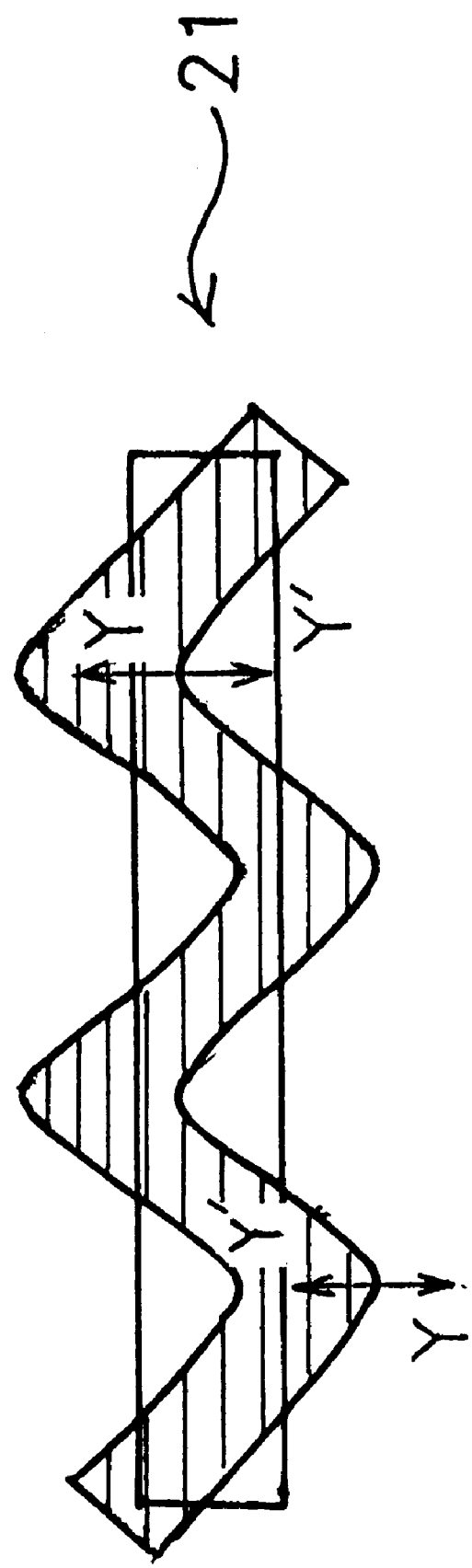
Figure 8C:
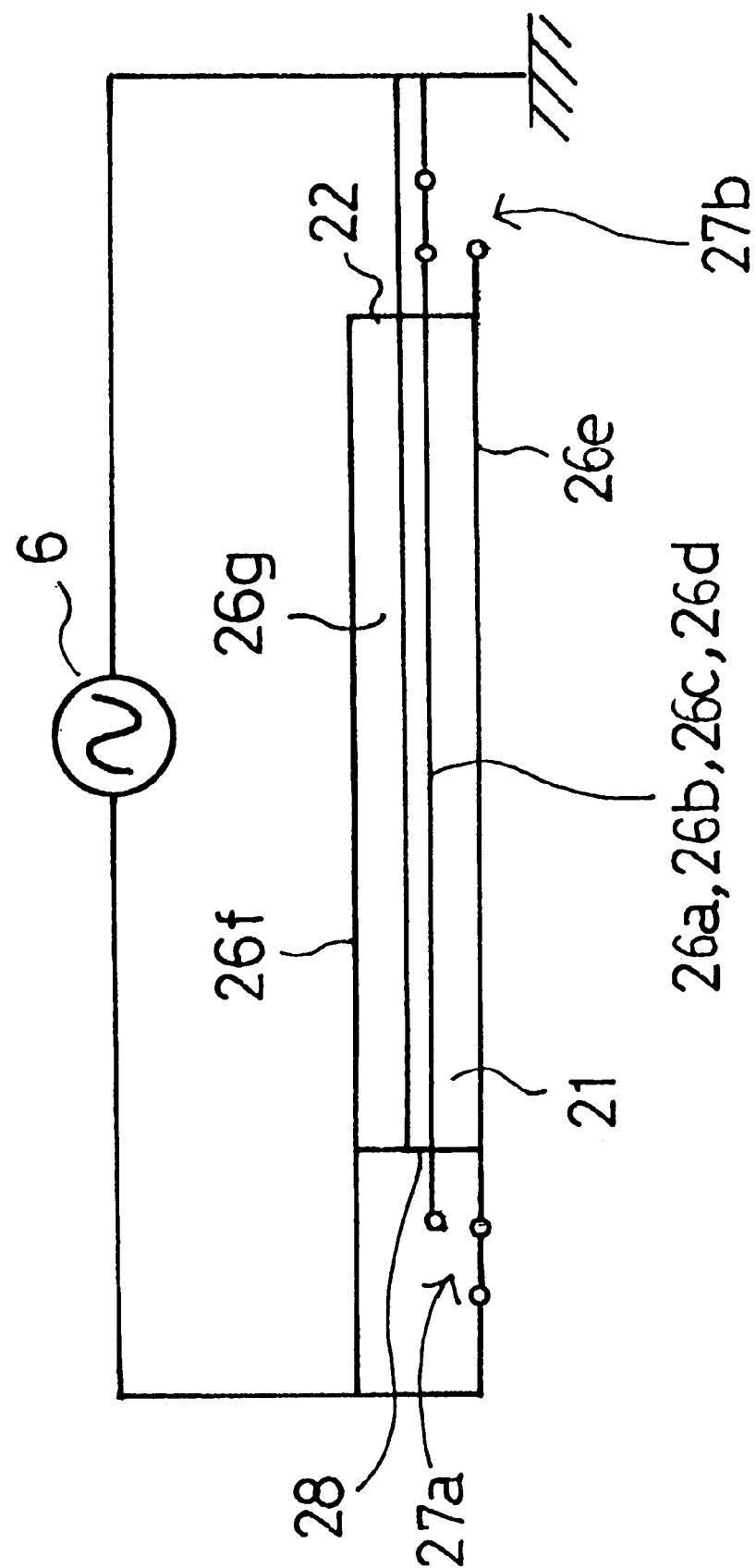
Figure 8D:
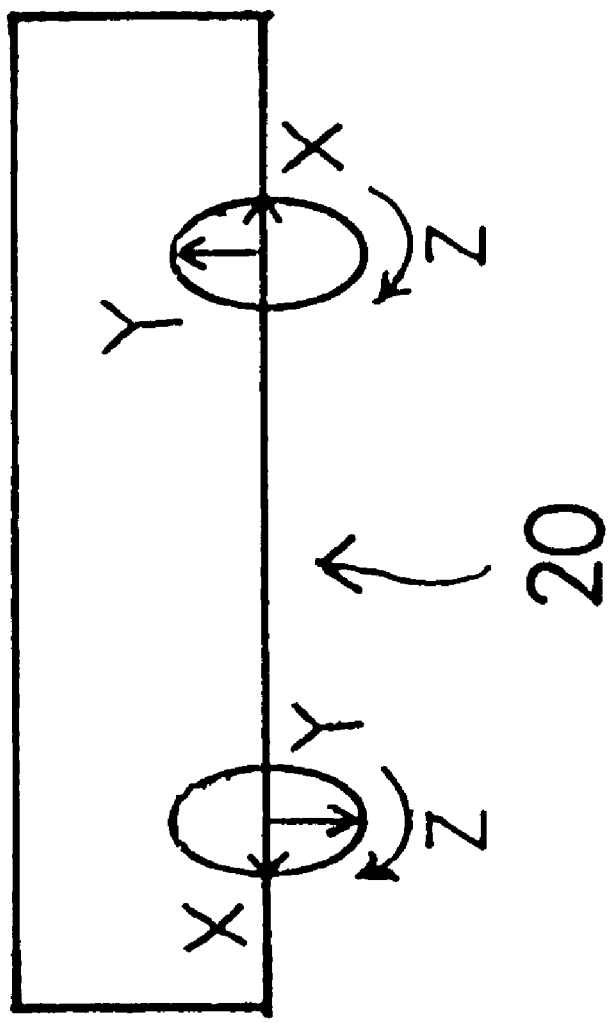
Figure 9A:
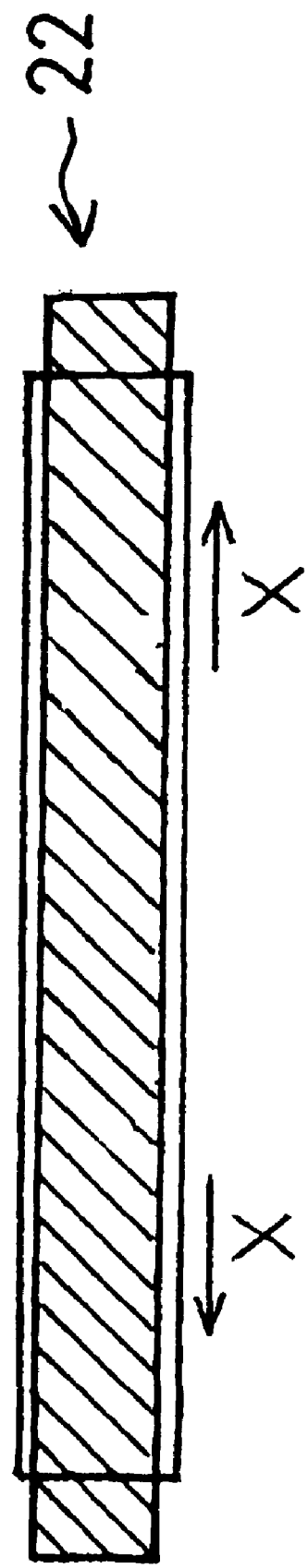
Figure 9B:
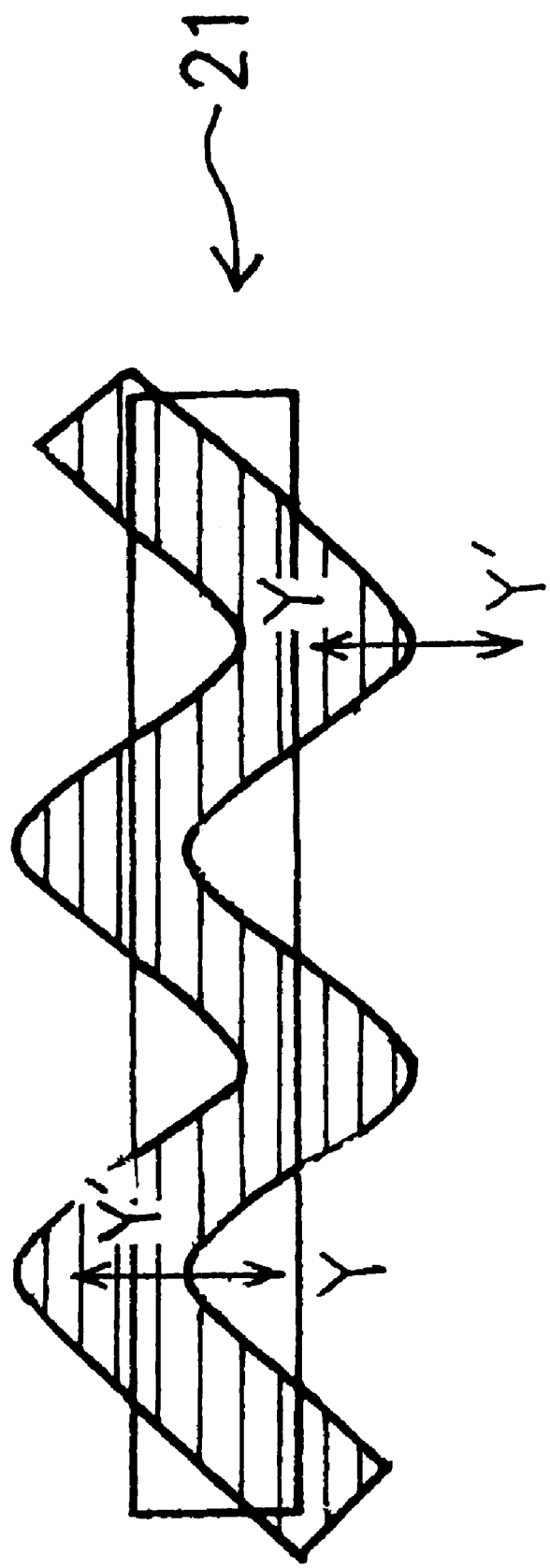
Figure 9D:
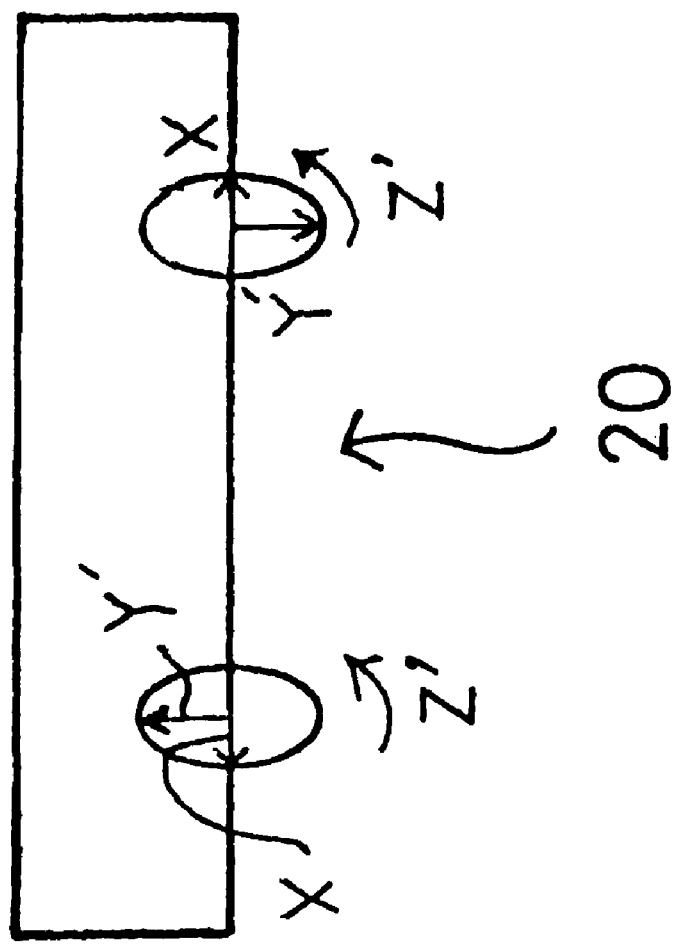
Figure 10A:
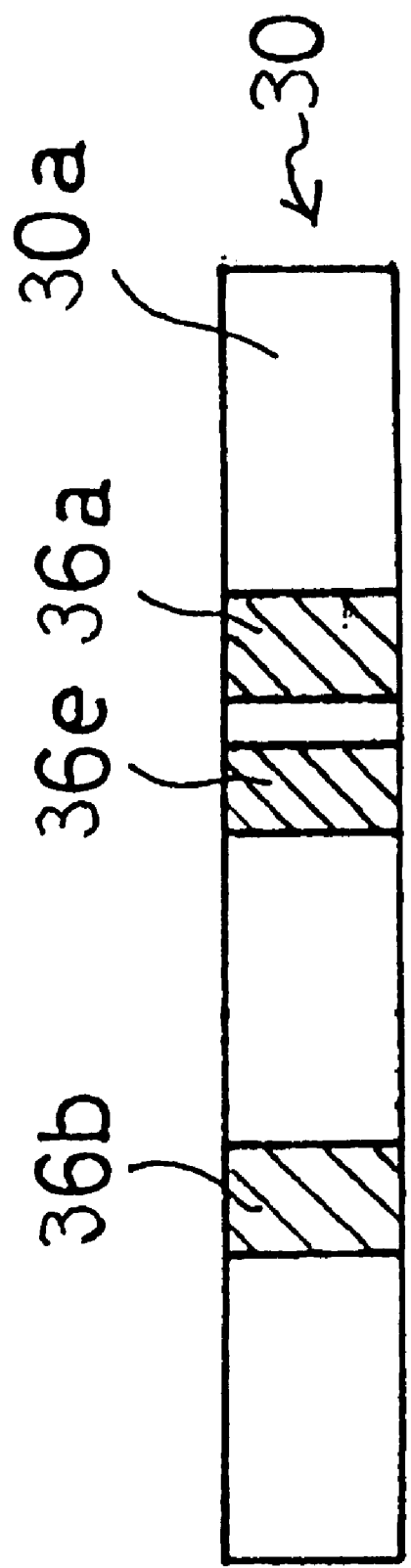
Figure 10C:
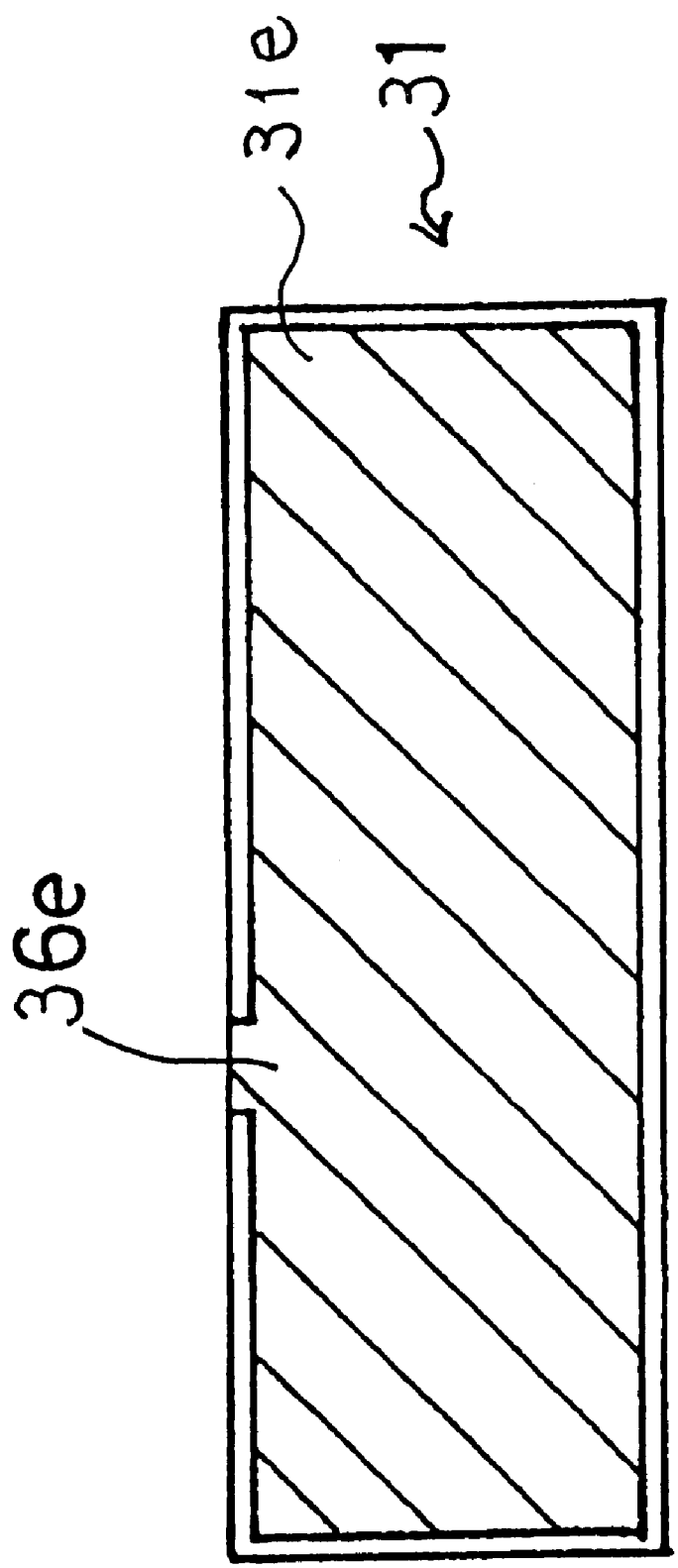
Figure 10D:
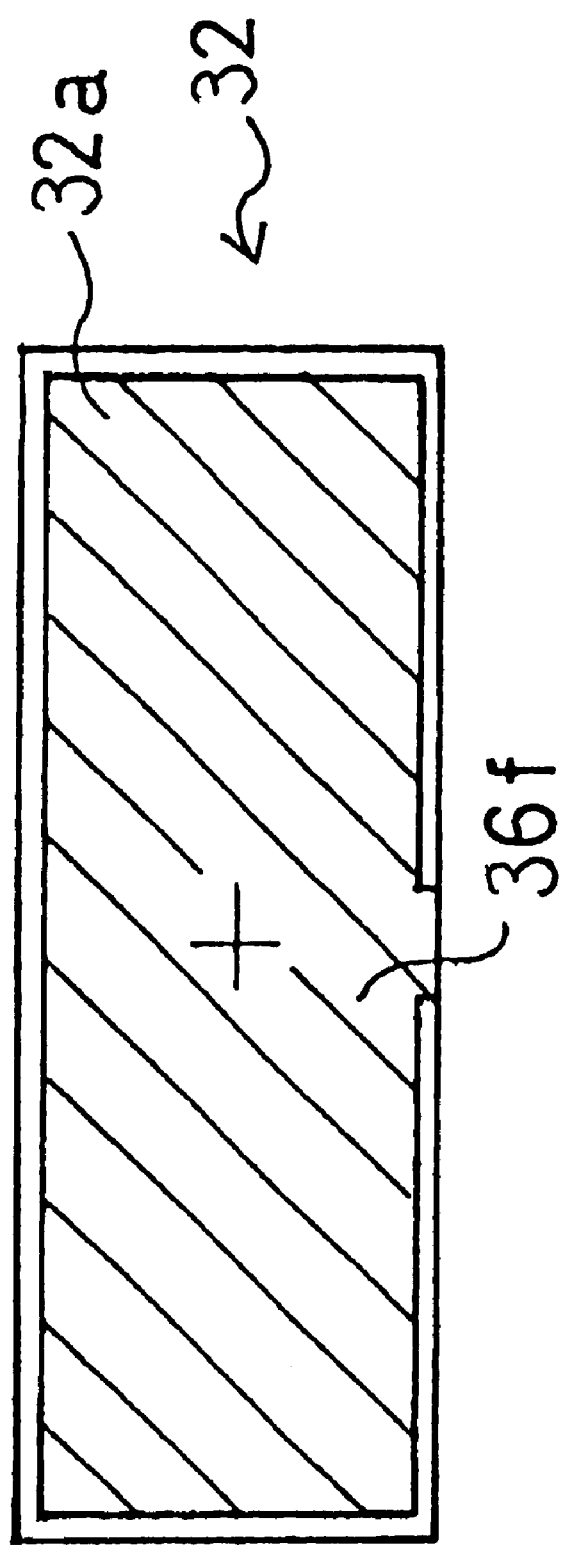
Figure 10E:
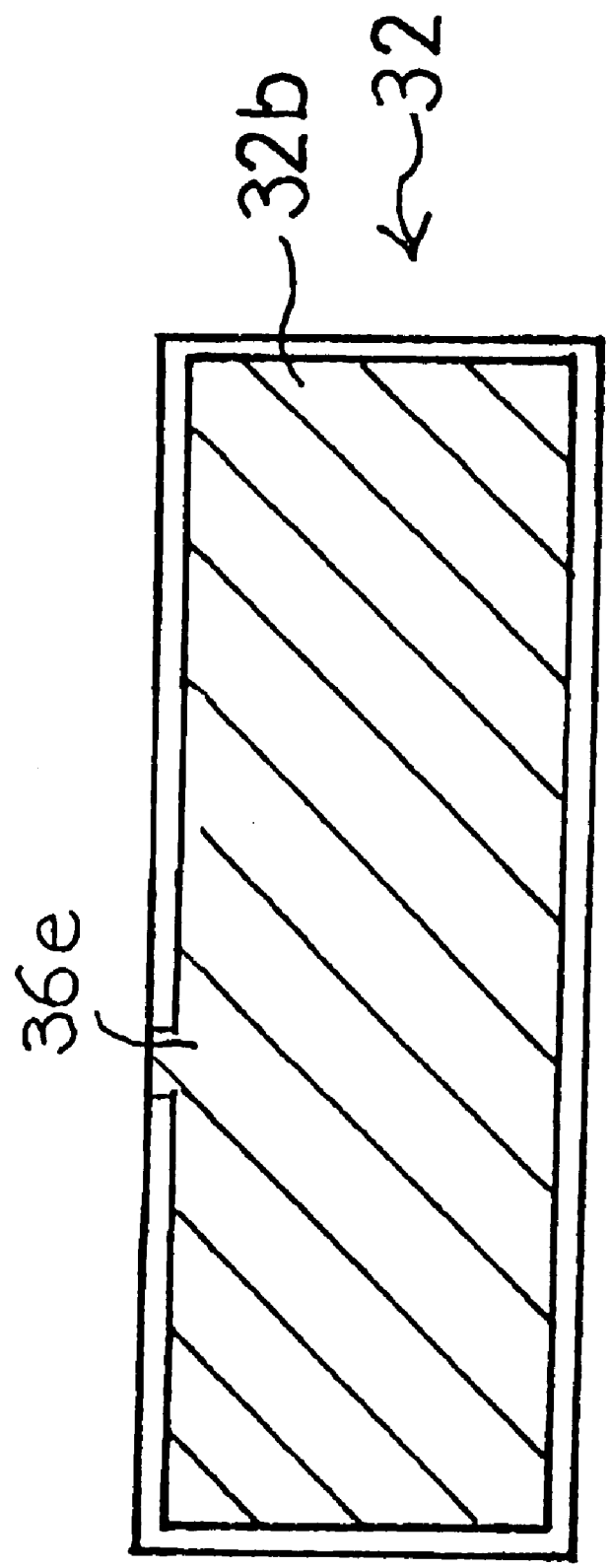
Figure 10F:
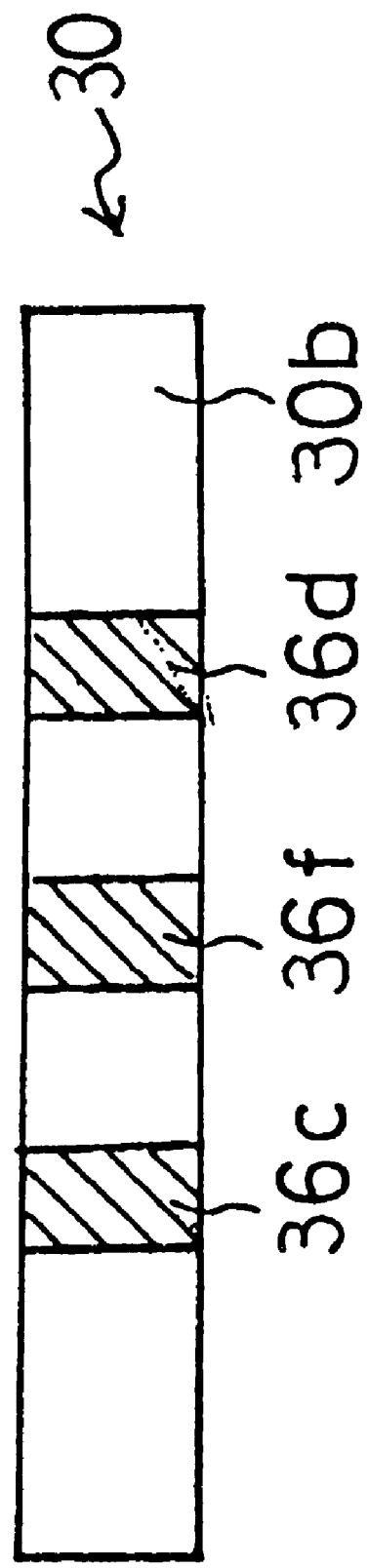
Figure 11:
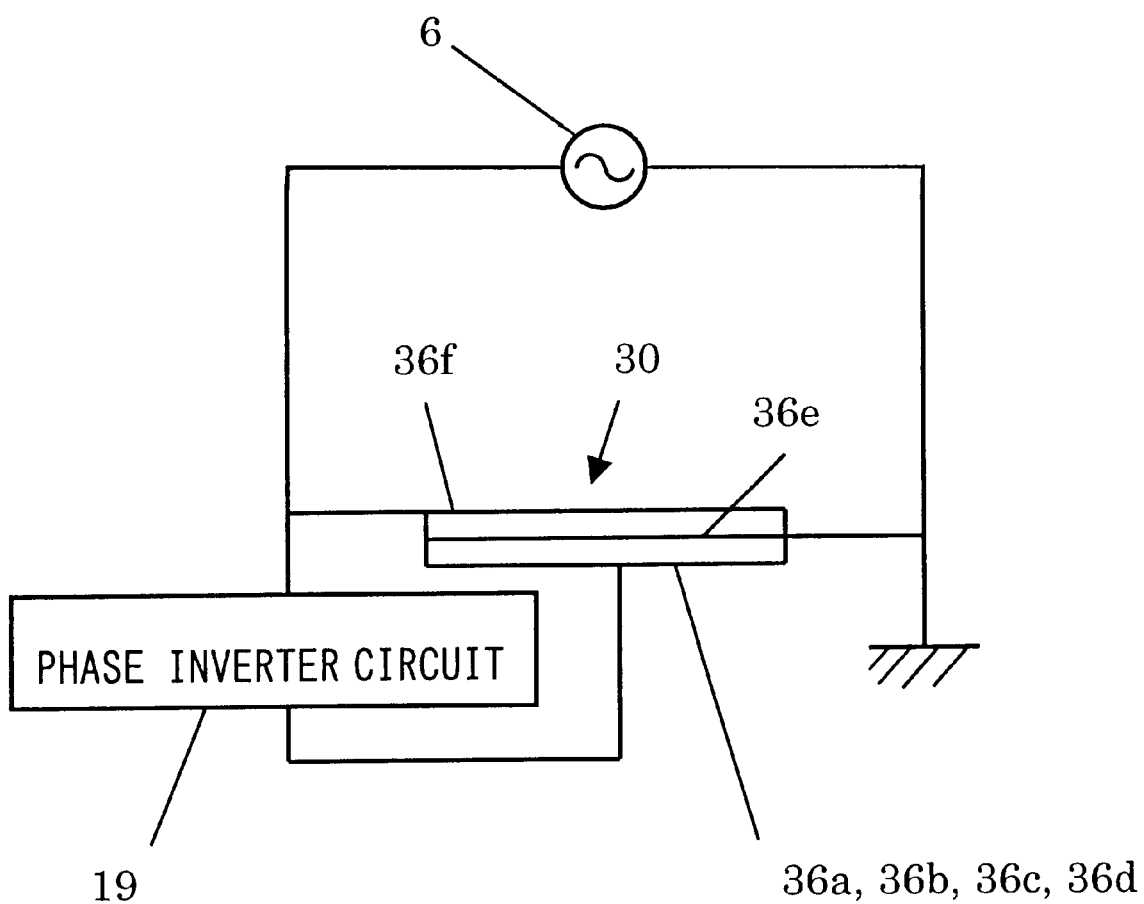
FIG. 11 is a diagram showing operation of a ultrasonic motor 3 according to a third embodiment of the invention.

FIG. 1a through FIG. 5d are views for explaining an ultrasonic motor 1 according to a first embodiment, FIG. 6 through FIG. 9d are views for explaining a ultrasonic motor 2 according to a second embodiment and FIG. 10a through FIG. 11 are views showing a third embodiment.

FIG. 12 is a diagram for explaining an electronic apparatus utilizing an ultrasonic motor according to a fourth embodiment.

First Embodiment

FIGS. 1a and 1b are views showing a total of a constitution of an ultrasonic motor 1.

As shown by a top view of FIG. 1a and a front view of FIG. 1b, the ultrasonic motor 1 is constituted by a piezoelectric element 10, a supporting member 13 for supporting the piezoelectric element 10 and an object portion 14 having a moving body 14a which is brought into contact with an end face of the piezoelectric element 10 and is moved by the piezoelectric element 10. That is, the ultrasonic motor 1 is a ultrasonic motor for moving the moving body 14a in a direction in parallel with the end face of the piezoelectric element 10.

Figure 2:
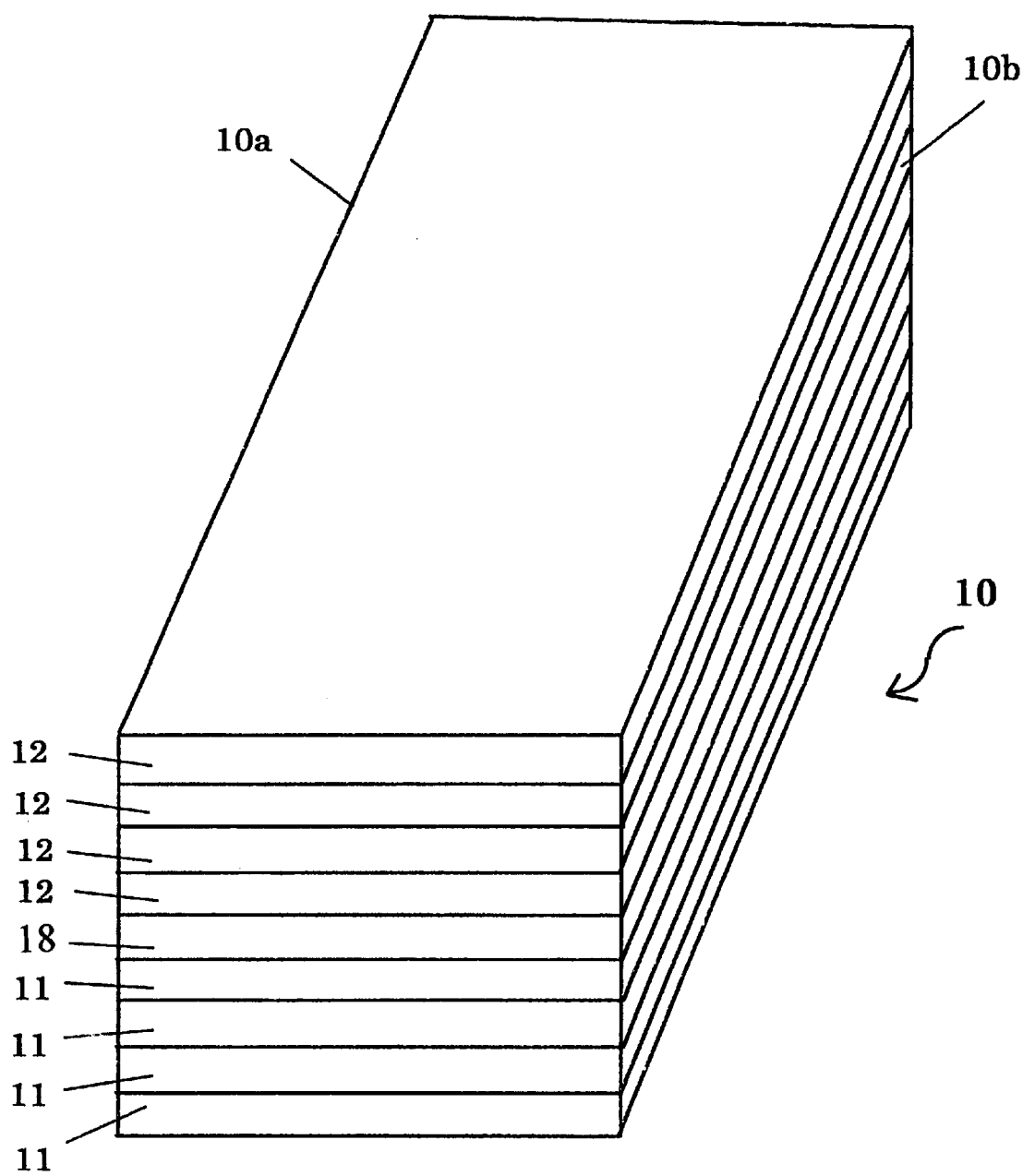
FIG. 2 is a view showing a constitution of a piezoelectric element 10 used in the ultrasonic motor 1.

As shown by FIG. 2, the piezoelectric element 10 is constituted by a structure in which, for example, four sheets of piezoelectric oscillators 11 (first piezoelectric oscillators) are integrally laminated as a source of bending vibration, on top thereof, for example, four sheets of piezoelectric oscillators 12 (second piezoelectric oscillators) are integrally laminated as a source of elongation and contraction vibration via a piezoelectric oscillator 18 constituting an insulating member. Further, the piezoelectric element 10 is provided with electrodes (illustration is omitted in FIG. 2), mentioned later.

Further, there may be installed a projection for driving the moving body 14a by being brought into contact therewith at substantially a central portion of the end face.

Here, an explanation will be given of polarized states of the piezoelectric oscillator 11 and the piezoelectric oscillator 12 as well as the structure of electrodes of the piezoelectric element 10 in reference to FIGS. 3a, 3b, 3c, 3d, 3e and 3f.

Figure 3A:
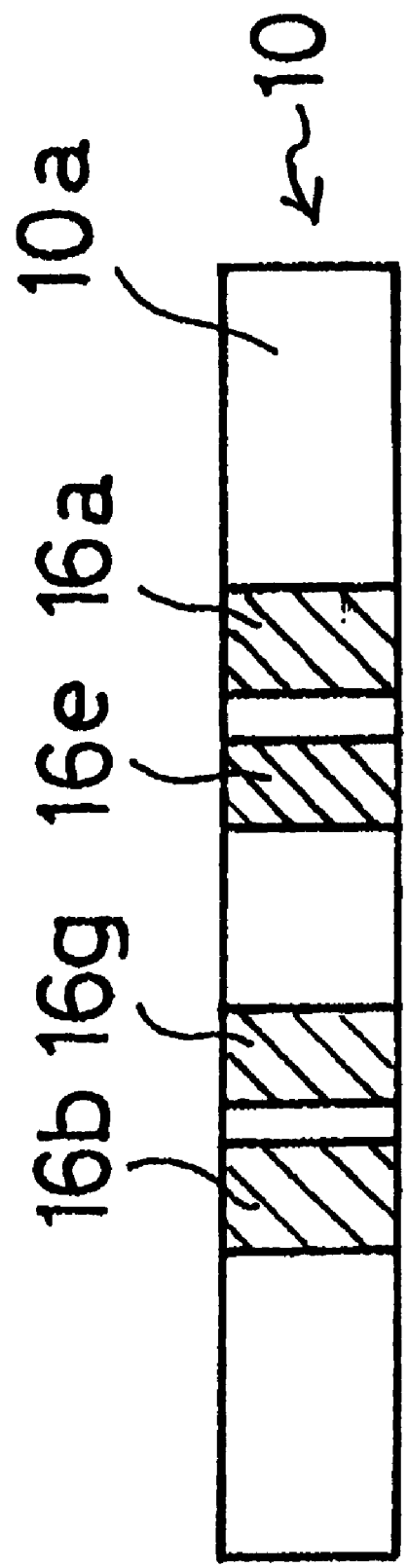
FIGS. 3a, 3b, 3c, 3d, 3e and 3f are views showing structures of a piezoelectric oscillator 11, a piezoelectric oscillator 12 and electrodes 16a, 16b, 16c, 16d, 16e, 16f and 16g used in the piezoelectric element 10.
Figure 3B:
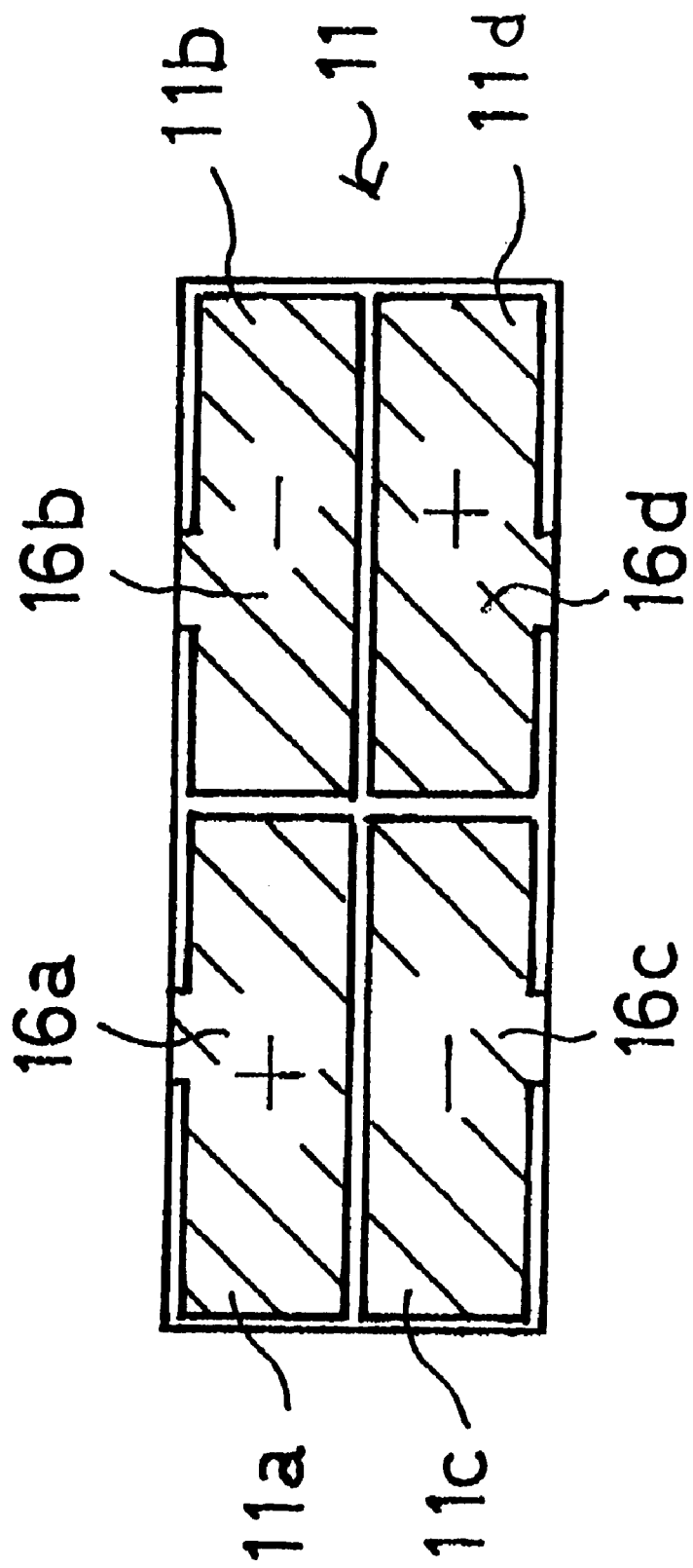
Figure 3C:
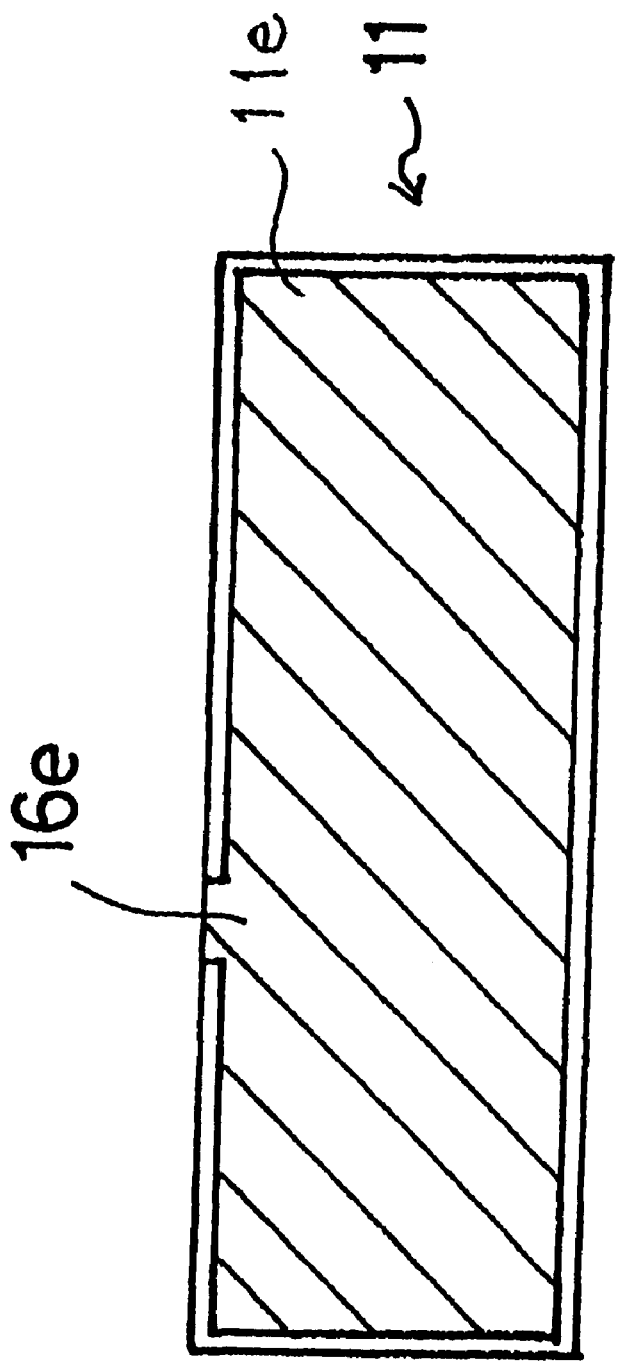
Figure 3D:
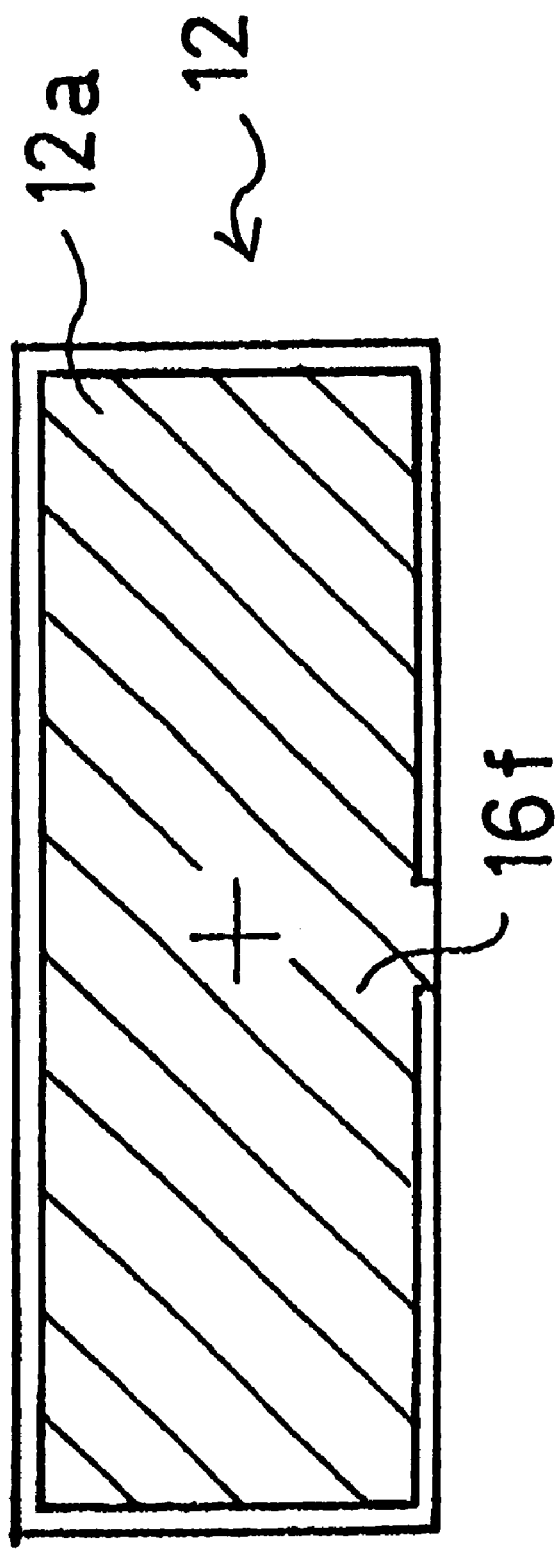
Figure 3E:
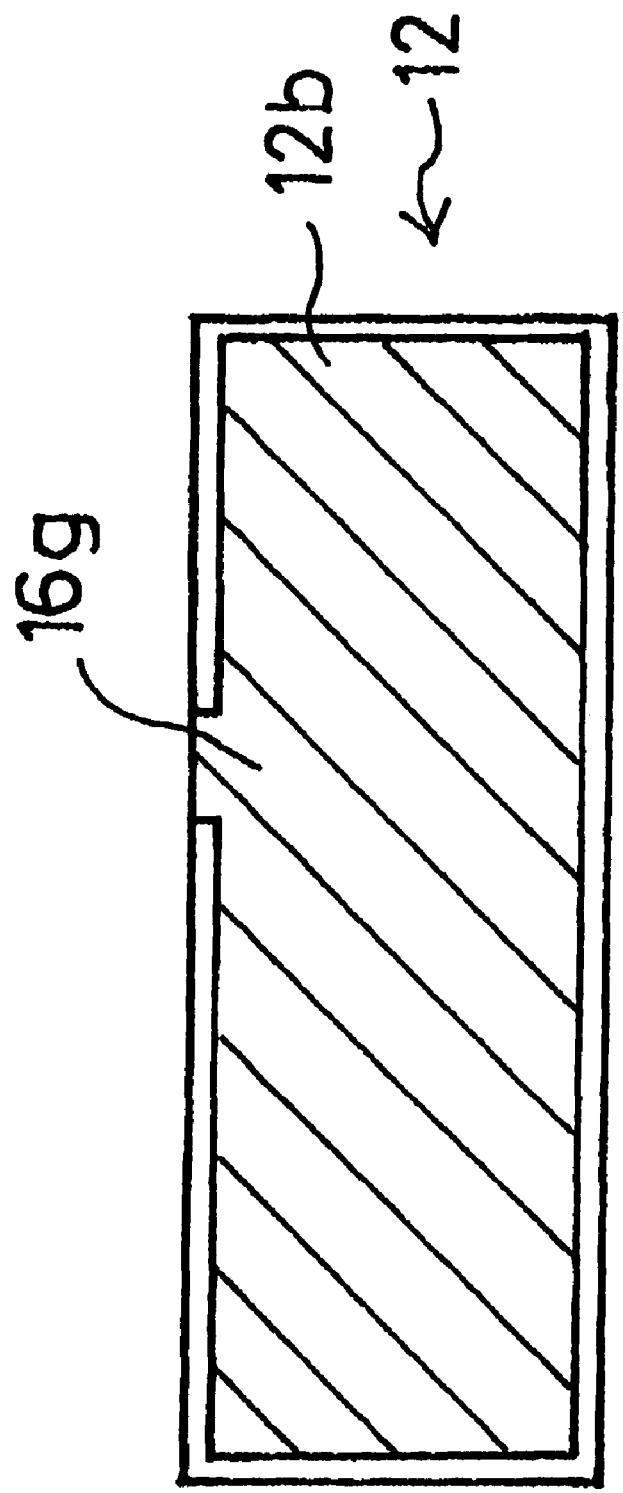
Figure 3F:
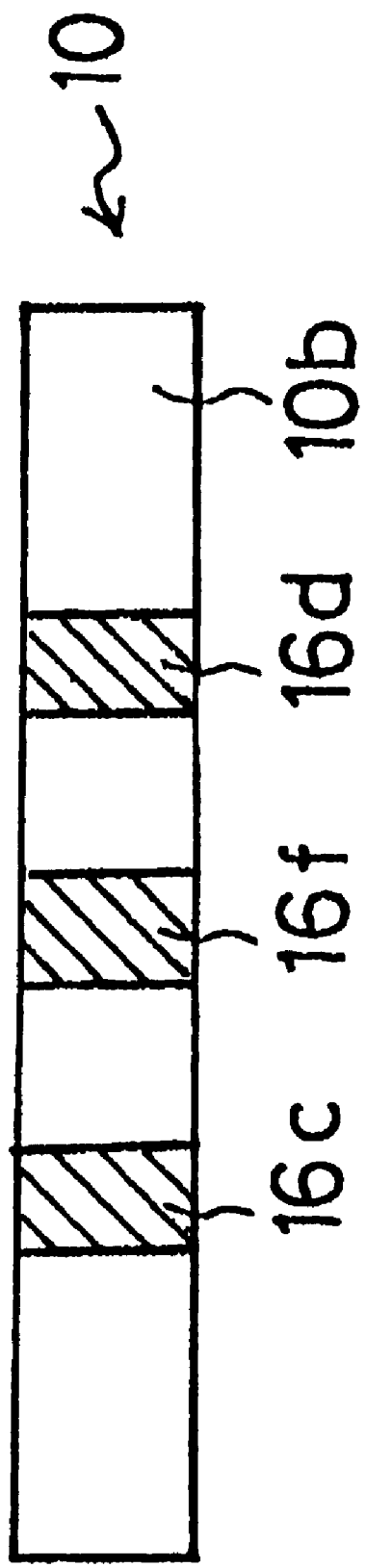

FIG. 3a is a view showing a side face 10a (refer to FIG. 2) of the piezoelectric element 10 and FIG. 3f is a view showing a side face 10b (refer to FIG. 2) thereof. FIG. 3b is a top view of odd number ones of the piezoelectric oscillators 11 and a bottom view of even number ones thereof and FIG. 3c is a bottom view of odd number ones of the piezoelectric oscillators 11 and a top view of even number ones thereof. Further, FIG. 3d is a top view of odd number ones of the piezoelectric oscillators 12 and a bottom view of even number ones thereof and FIG. 3e is a bottom view of odd number ones of the piezoelectric oscillators 12 and a top view of even number ones thereof. That is, coupling faces of the respective piezoelectric oscillators constitute common electrodes.

First, an explanation will be given of polarized states of the piezoelectric oscillator 11 and the piezoelectric oscillator 12.

As shown by FIG. 3b and FIG. 3c, the piezoelectric oscillator 11 is constituted by a structure in which four of a polarized region 11a, a polarized region 11b, a polarized region 11c and a polarized region 11d formed by dividing the piezoelectric oscillator 11 in two in the vertical direction and dividing the piezoelectric oscillator 11 in two also in the horizontal direction, are polarized reversely alternately in a laminating direction. That is, the polarized region 11a and the polarized region 11d are brought into a state, for example, top faces thereof become plus and the polarized region 11b and the polarized region 11c are brought into a state in which, for example, top faces thereof become minus.

Further, as shown by FIG. 3d and FIG. 3e, substantially an entire face of the piezoelectric oscillator 12 constitutes a single one of a polarized region and the piezoelectric oscillator 12 is polarized such that, for example, a top face thereof becomes plus in the laminating direction.

Next, an explanation will be given of the structure of the electrodes of the piezoelectric element 10 in reference to FIGS. 3a, 3b, 3c, 3d and 3e and 3f.

The piezoelectric element 10 is provided with an electrode 16a, an electrode 16b, an electrode 16c, an electrode 16d, an electrode 16e, an electrode 16f and an electrode 16g.

Among them, the electrodes 16a, 16b, 16c, 16d and 16e are electrodes for inputting signals to the piezoelectric oscillator 11 and the electrodes 16f and 16g are electrodes for inputting signals to the piezoelectric oscillator 12.

The electrode 16a substantially covers one face of the polarized region 11a of the piezoelectric oscillator 11 and a portion thereof is drawn to the side face 10a. That is, all of top faces of the polarized regions 11a of four sheets of the piezoelectric oscillators 11 are brought into the same potential by the electrode 16a continuous thereto via portions thereof drawn to the side face 10a.

Similarly, the electrode 16b substantially covers one face of the polarized region 11b of the piezoelectric oscillator 11 and a portion thereof is drawn to the side face 10a. That is, all of top faces of the polarized regions 11b of four sheets of the piezoelectric oscillators 11 are brought into the same potential by the electrode 16b continuous thereto via portions thereof drawn to the side face 10a.

Further, the electrode 16c substantially covers one face of the polarized region 11c of the piezoelectric oscillator 11 and a portion thereof is drawn to the side face 10b. That is, all of faces on one side of the polarized regions 11c of four sheets of the piezoelectric oscillators 11 are brought into the same potential by the electrode 16c continuous thereto via portions thereof drawn to the side face 10b.

Similarly, the electrode 16d substantially covers one face of the polarized region 11d of the piezoelectric oscillator 11 and a portion thereof is drawn to the side face 10b. That is, all of faces on one side of the polarized regions 11d of four sheets of the piezoelectric oscillators 11 are brought into the same potential by the electrode 16d continuous thereto via portions thereof drawn to the side face 10b.

Further, the electrode 16e covers all of other faces of four of the polarized regions 11a, 11b, 11c and 11d of the piezoelectric oscillator 11 and portions thereof are drawn to the side face 10a. That is, all of the other faces of the four polarized regions of four sheets of the piezoelectric oscillators 11 are brought in the same potential by the electrode 16d continuous thereto via portions thereof drawn to the side face 10a.

Further, in the case in which in the piezoelectric oscillator 11, with the electrode 16e as a reference electrode, the same drive signal is inputted to the electrodes 16a, 16b, 16c and 16d, when the polarized regions 11a and 11d are elongated, the polarized regions 11b and 11c are contracted, further, when the polarized regions 11a and 11d are conversely contracted, the polarized regions 11b and 11c are elongated. Further, strains to which four of the piezoelectric oscillators contribute are the same since four of them are laminated in a direction orthogonal to a displacement direction. Accordingly, the piezoelectric oscillator 11 carries out bending vibration in the horizontal direction.

Figure 13B:
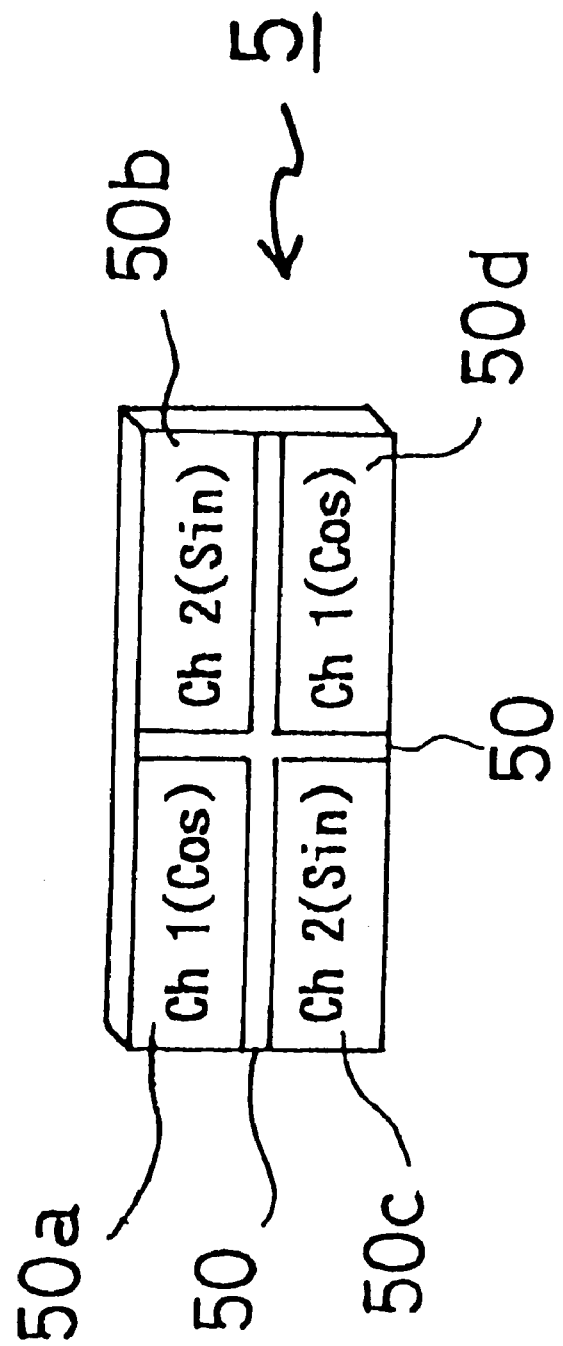
Figure 14:
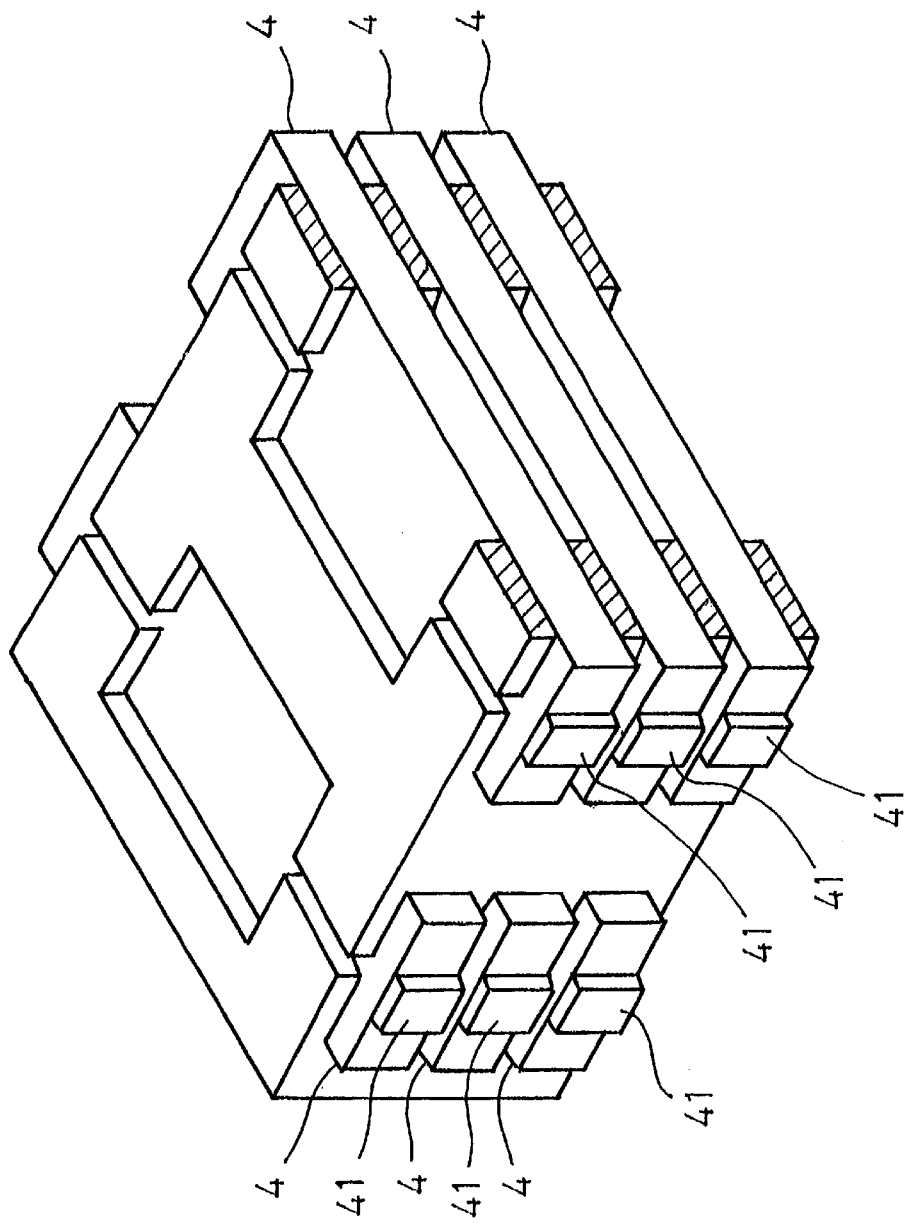
FIG. 14 is a view showing a method of using a plurality of the ultrasonic motors 4 or the ultrasonic motors 5 in parallel with each other as a conventional example.

That is, all of four of the piezoelectric oscillators 11 carry out bending oscillation in the same direction since the same drive signals are inputted to the same polarized regions. Therefore, large bending vibration is produced in the piezoelectric element 10. Further, only the bending vibration is excited in the piezoelectric oscillator 11 different from the conventional examples shown by FIG. 13a and 13b.

Further, the electrode 16f substantially covers the top face of the polarized region 12a of the piezoelectric oscillator 12 and a portion thereof is drawn to the side face 10b. That is, all of top faces of the polarized regions 12a of four sheets of the piezoelectric oscillators 12 are brought into the same potential by the electrode 16f continuous thereto via portions thereof drawn to the side face 10b.

Similarly, the electrode 16g substantially covers other face of the polarized region 12a of the piezoelectric oscillator 12 and a portion thereof is drawn to the side face 10a. That is, other faces of the polarized regions 12a of the four sheets of the piezoelectric oscillators 12 are brought into the same potential by the electrode 16g continuous thereto via portions thereof drawn to the side face 10a.

Further, when in the piezoelectric oscillator 12, with the electrode 16g as a reference, a drive signal is inputted to the electrode 16f, the polarized region 12a is elongated or contracted and accordingly, the piezoelectric oscillator 12 carries out elongation and contraction movement in the longitudinal direction.

That is, four sheets of the piezoelectric oscillators 12 carry out the same elongation and contraction vibration since the same drive signals are inputted to the same polarized regions. Accordingly, large elongation and contraction vibration is produced in the piezoelectric element 10.

Next, an explanation will be given of an example of fabrication procedure of the piezoelectric element 10.

First, a piezoelectric ceramics powder mixed with predetermined materials by predetermined rates, is kneaded by mixing an organic solvent or the like as necessary and is formed to be a predetermined shape and calcined. The condition of calcination is substantially the same as that in fabricating normal piezoelectric ceramics.

Next, one face of the calcined piezoelectric ceramics is coated with conductive paste for electrode by dividing it to correspond to the respective polarized regions. That is, a first one of a piece of the piezoelectric ceramics for constituting the piezoelectric oscillator 11 or 18 is coated therewith in four divisions, a second one thereof is coated therewith substantially over an entire face except a peripheral portion thereof, thereafter, a third one thereof, a fourth one thereof . . . are coated with electrodes which are alternately different from each other. A first one, a second one ... each of one face of a piece of the piezoelectric ceramics for constituting the piezoelectric oscillator 12, are alternately coated with the electrodes 16f and 16g.

Next, a total of five sheets of pieces of the piezoelectric ceramics for constituting the piezoelectric oscillators 11 and 13 and coated with the conductive paste for electrode, are laminated, on top thereof, four sheets of pieces of the piezoelectric ceramics for constituting the piezoelectric oscillators 12 and coated with the conductive paste for electrode, are laminated and thereafter, regular burning is carried out in respect thereof. The condition of the regular burning is substantially the same as that in fabricating normal piezoelectric ceramics. By the regular burning, the piezoelectric oscillators 11, the piezoelectric oscillator 18 and the piezoelectric oscillators 12 are integrally formed.

Next, by coating and drying paste for electrode at predetermined positions of side faces of the pieces of the piezoelectric ceramics which have been regularly burnt, the electrodes 16a, 16b, 16c, 16d, 16e, 16f and 16g are formed in a predetermined structure. Therefore, the coupling faces of the respective piezoelectric oscillators constitute common electrodes.

Next, by applying predetermined voltages on the electrodes 16a, 16b, 16c and 16d with the electrode 16e as a reference and on the electrode 16f with the electrode 16g as a reference, the polarized regions 11a, 11b, 11c, 11d, lie, 12a and 12b are polarized in predetermined directions to thereby finish the piezoelectric element 10. At this occasion, the intermediary piezoelectric oscillator 18 is not applied with voltage and therefore, the polarizing treatment is not carried out. Further, the piezoelectric oscillator 18 serves as an insulating member between the piezoelectric oscillators 11 and 12. Incidentally, the insulating member 18 may use other material regardless of the piezoelectric oscillator.

An explanation will be given of operation of the ultrasonic motor 1 having the above-described structure in reference to FIGS. 4a, 4b, 4c and 4d and FIGS. 5a, 5b, 5c and 5d.

FIG. 4b and FIG. 5b are view showing a connecting structure of the ultrasonic motor 1 and an alternating current power source (signal source) 6.

That is, in the ultrasonic motor 1, the electrode 16e and the electrodes 16a, 16b, 16c and 16d of the piezoelectric oscillator 11 are respectively connected to the alternating current power source 6 via switches 17a and 17b (switching means). Further, the electrode 16f of the piezoelectric oscillator 12 is directly connected to the output side of the alternating current power source 6 and the electrode 16g thereof is directly connected to the reference potential side, respectively.

Therefore, connecting directions of the electrodes 16a, 16b, 16c, 16d and 16e, that is, whether these electrodes are connected to the output side of the alternating current power source 6 or to the ground potential side thereof, is switched by the switch 17a and the switch 17b.

Further, in FIGS. 4a, 4b, 4c and 4d and FIGS. 5a, 5b, 5c and 5d, constituent elements of the ultrasonic motor 1 other than the piezoelectric element 10, are omitted for convenience of explanation, further, in these drawings, for convenience of explanation, the piezoelectric element 10 is provided with a structure in which one sheet of the piezoelectric oscillator 11 and the one sheet of the piezoelectric oscillator 12 are integrally laminated by interposing the insulating member 18.

Figure 4A:
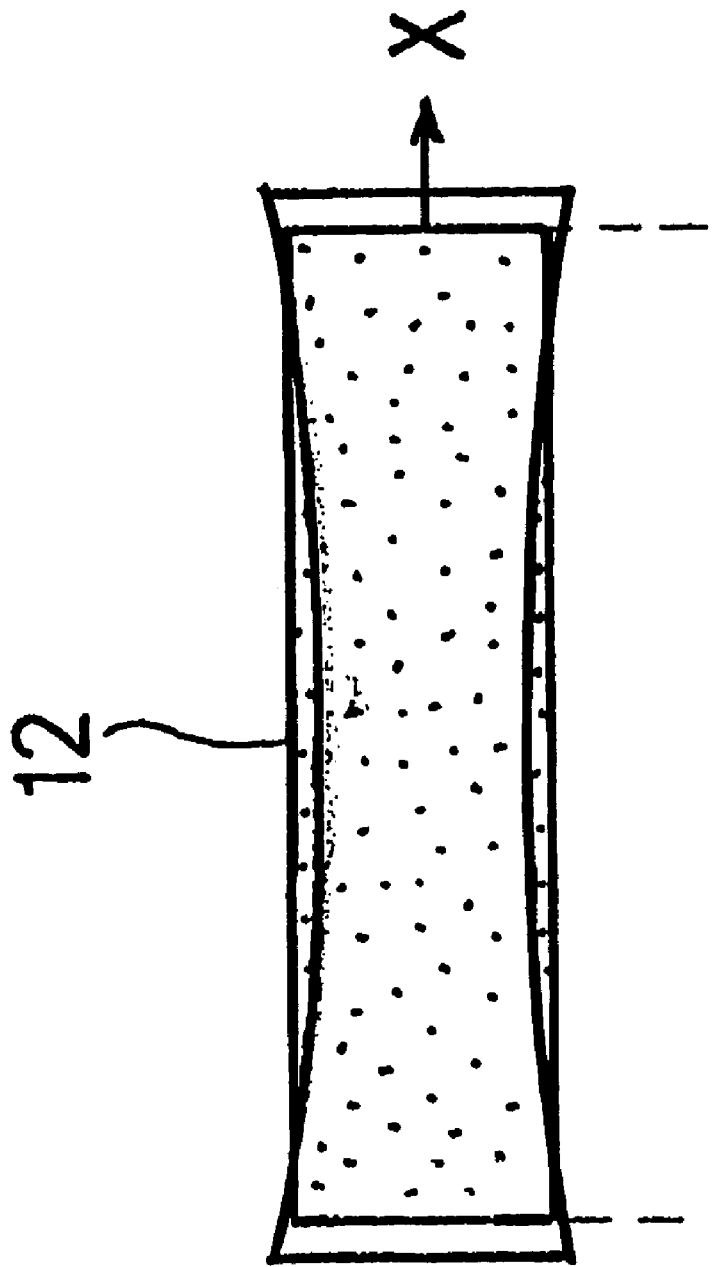

First, an explanation will be given of operation of the ultrasonic motor 1 when the electrodes 16a, 16b, 16c and 16d are connected to the output side and the electrode 16e is connected to the ground potential side via the switch 17a and the switch 17b as shown by FIG. 4b, in reference to FIGS. 4a, 4c and 4d.

Figure 4D:
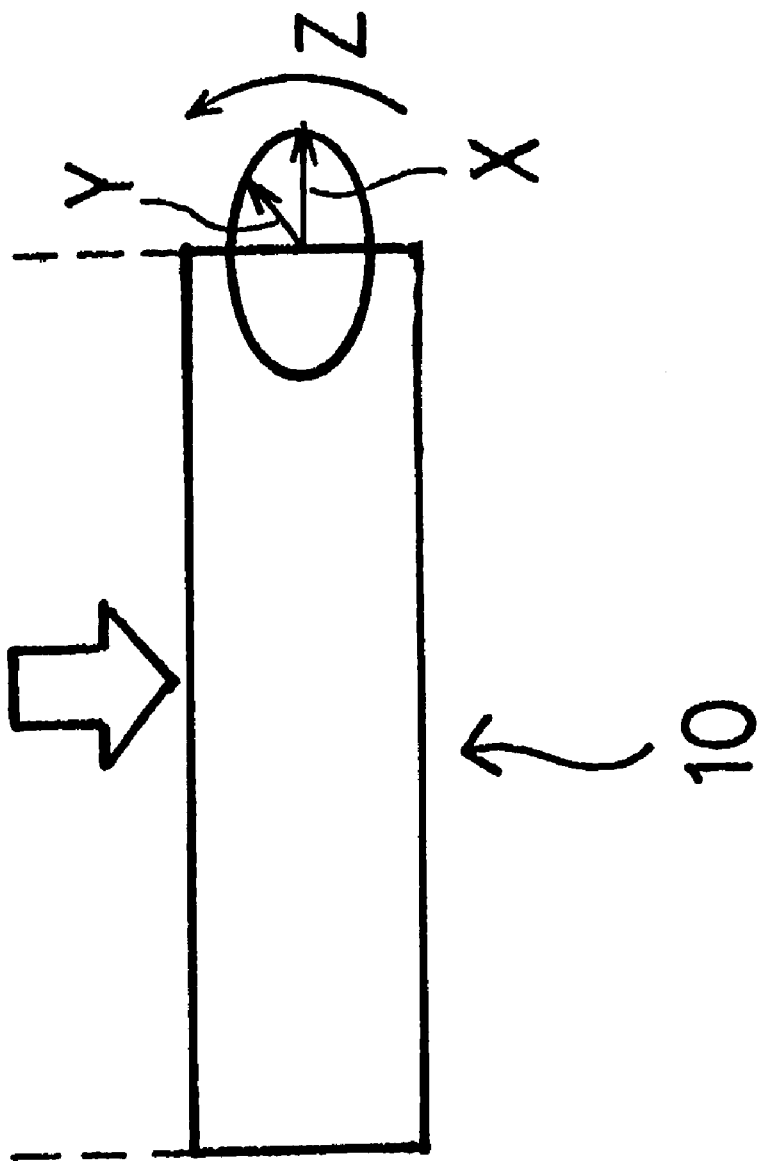

FIG. 4a shows a behavior of elongation and contraction vibration of the piezoelectric oscillator 12, FIG. 4c shows a behavior of bending vibration of the piezoelectric oscillator 11, respectively, by top views and FIG. 4d shows a drive state of the ultrasonic motor 1 when viewed from above.

When output potential of the alternating current power source 6 becomes higher than the reference potential, the polarized region 11a and the polarized region 11d of the piezoelectric oscillator 11 are elongated in the longitudinal direction and the polarized region 11b and the polarized region 11c are contracted in the longitudinal direction. Accordingly, the piezoelectric oscillator 11 is bent as shown by void portions of FIG. 4c and the end face is inclined in a direction designated by an arrow mark Y.

At this occasion, as mentioned above, substantially an entire face of the piezoelectric oscillator 12 is polarized in a direction the same as that of the polarized region 11a and accordingly, as shown by void portions of FIG. 4a, the piezoelectric oscillator 12 is elongated in the longitudinal direction and the end face is elongated in a direction designated by an arrow mark X.

Further, when the output potential of the alternating current power source 6 becomes lower than the reference potential, the end face of the piezoelectric oscillator 11 is inclined in a direction of an arrow mark Y' contrary to the arrow mark Y, further, the end face of the piezoelectric oscillator 12 is contracted in a direction reverse to the arrow mark X by 180 degree.

That is, the bending vibration produced in the piezoelectric oscillator 11 and the elongation and contraction vibration produced at the piezoelectric oscillator 12 are synthesized, as a result, the end face of the piezoelectric element 10 carries out an elliptic motion in a direction shown by an arrow mark Z of FIG. 4d, therefore, the ultrasonic motor 1 moves a moving body (illustrated is omitted) which is brought into press contact with the end face in the direction designated by the arrow mark Z.

Figure 5A:
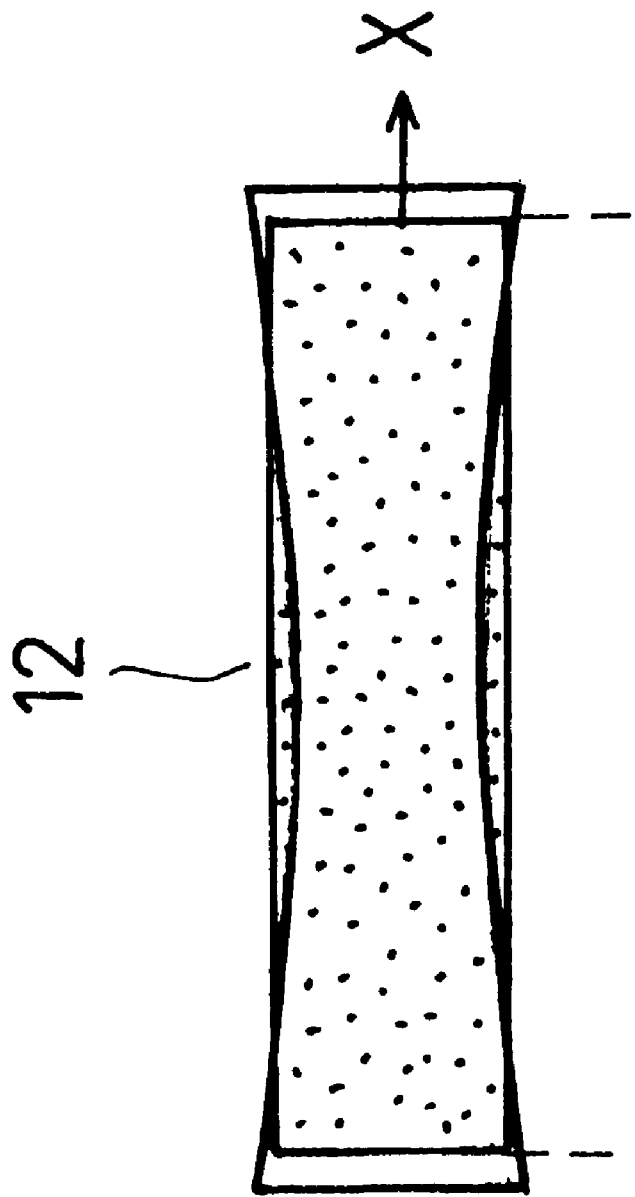

Next, an explanation will be given of the operation of the ultrasonic motor 1 when contrary to FIG. 4, the electrodes 16a, 16b, 16c and 16d are connected to the reference potential side and the electrode 16e is connected to the output side as shown by FIG. 5b, in reference to FIG. 5a, 5c and 5d.

Figure 5C:
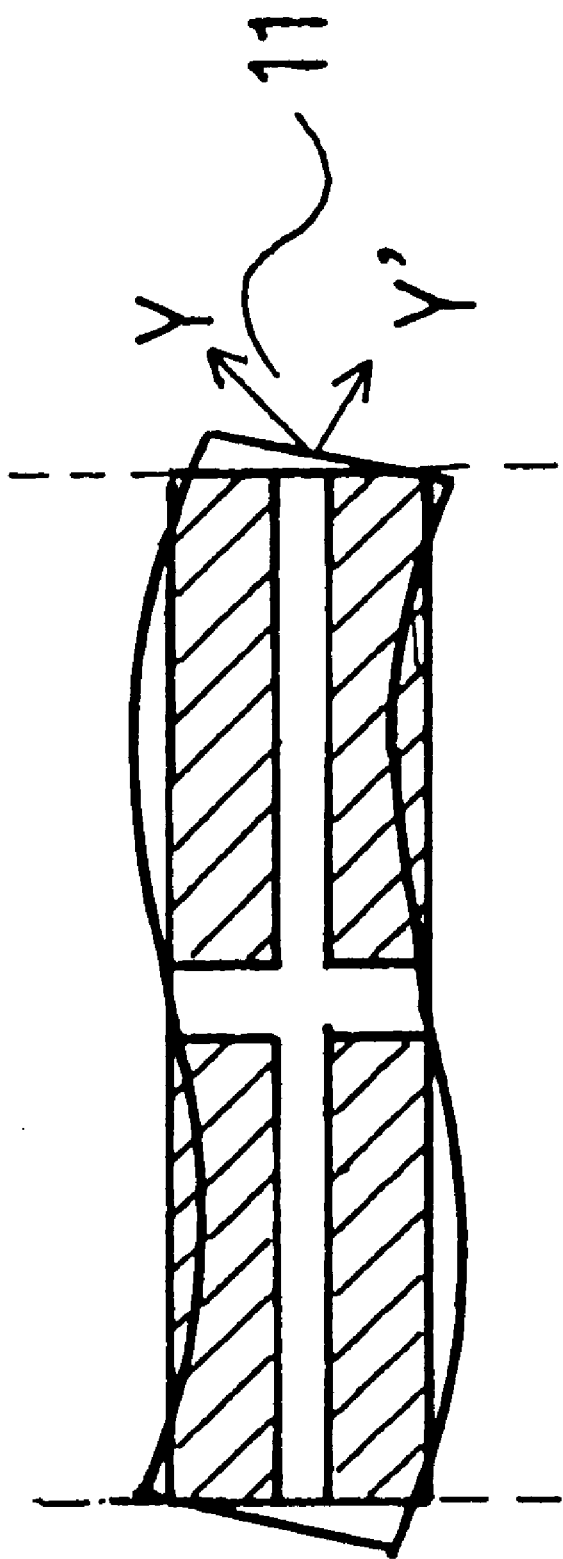
Figure 5D:
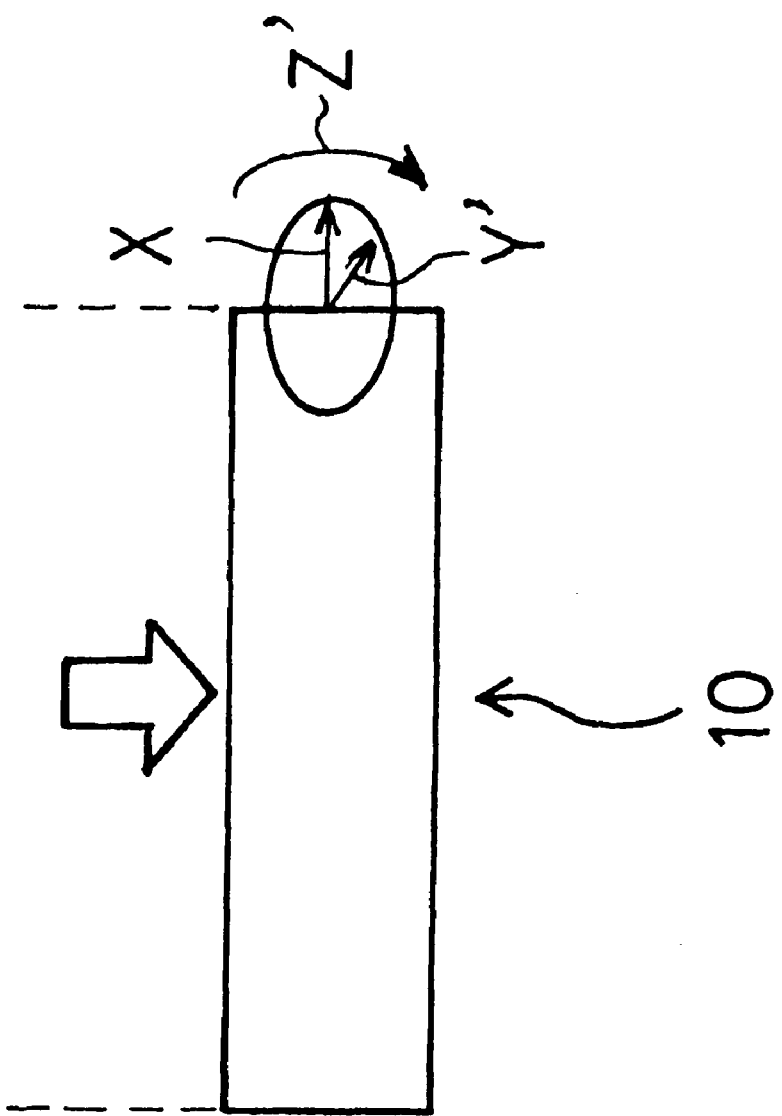

FIG. 5a shows the behavior of the elongation and contraction vibration of the piezoelectric oscillator 12 and FIG. 5c shows the behavior of the bending vibration of the piezoelectric oscillator 11, respectively by using top views and FIG. 5d shows the drive state of the ultrasonic motor 1 when viewed from above.

When the output potential of the alternating current power source 6 becomes higher than the reference potential, the polarized region 11a and the polarized region 11d of the piezoelectric oscillator 11 are contracted in the longitudinal direction and the polarized region 11b and the polarized region 11c are elongated in the longitudinal direction. Accordingly, the piezoelectric oscillator 11 is bent as shown by void portions of FIG. 5c and the end face is inclined in a direction designated by an arrow mark Y'.

At this occasion, as mentioned above, substantially the entire face of the piezoelectric oscillator 12 is polarized in the direction the same as that of the polarized region 11a and accordingly, the piezoelectric oscillator 12 is elongated in the longitudinal direction as shown by void portions of FIG. 5a and the end face is elongated in the direction designated by the arrow mark X.

Further, when the output potential of the alternating current power source 6 becomes lower than the reference potential, the end face of the piezoelectric oscillator 11 is inclined in the direction of the arrow mark Y contrary to the arrow mark Y', further, the end face of the piezoelectric oscillator 12 is contracted in the direction reverse to the arrow mark X by 180 degree.

Therefore, the end face of the piezoelectric oscillator 10 carries out the elliptic motion in a direction designated by an arrow mark Z' of FIG. 5d, accordingly, the ultrasonic motor 1 moves a moving body (illustration is omitted) which is brought into press contact with the end face in the direction designated by the arrow mark Z', that is, in a direction reverse to the arrow mark Z of FIG. 4d.

That is, the electrode 16e of the piezoelectric oscillator 11 of the ultrasonic motor 1 is connected to the alternating current power source 6 via the switch 17a, further, the electrodes 16a, 16b, 16c and 16d are connected thereto via the switch 17b, respectively, and therefore, by only switching both of the switches 17a and 17b, the direction in which the ultrasonic motor 1 moves the moving body 14a can be reversed.

In this way, according to the ultrasonic motor 1 of the first embodiment of the invention, the piezoelectric oscillators 12 as the elongation and contraction vibration source are integrally laminated on the piezoelectric oscillators 11 as the bending vibration source and therefore, for example, by separately setting and changing the reference potential of the piezoelectric oscillators 11 and the reference potential of the piezoelectric oscillators 12, the elongation and contraction vibration and the bending vibration can separately be controlled.

Further, the bending vibration is carried out by inputting drive signals from the alternating current power source 6 to all of the polarized regions 11a, 11b, 11c and 11d of the piezoelectric oscillators 11 and accordingly, only the bending vibration is excited and further, the drive force is large and the output of the ultrasonic motor 1 is larger than that of the conventional ultrasonic motor.

Further, pluralities of the piezoelectric oscillators 11 and the piezoelectric oscillators 12 are respectively used and accordingly, the output is further magnified.

Further, the ultrasonic motor 1 is driven by a single one of the input signal and accordingly, the constitution of the self-excited oscillation circuit is simplified and the self-excited oscillation control is facilitated.

Further, when the electrode 16e of the piezoelectric oscillator 11 is connected to the alternating current power source 6 via the switch 17a and the electrodes 16a, 16b, 16c and 16d are connected thereto via the switch 17b, respectively, by only switching both of the switches 17a and 17b, the ultrasonic motor 1 moves the moving body 14a in the reverse direction.

It goes without saying that the ultrasonic motor 1 can be driven even when the piezoelectric oscillators 11 and 12 are applied with signals having different phases, for example, signals of 90 degree or −90 degree.

Further, although according to the embodiment, in the piezoelectric element 10, four sheets of the piezoelectric oscillators 11 are integrally laminated, on top thereof, four sheets of the piezoelectric oscillators 12 are integrally laminated, the invention is not limited thereto but there may be constructed a structure in which the piezoelectric oscillators 11 and the piezoelectric oscillators 12 are laminated alternately and integrally. Further, numbers of sheets of the piezoelectric oscillators 11 and 12 may naturally be set arbitrarily and both need not to be the same. Particularly, by making the numbers different from each other, the two vibration forces can be controlled independently from each other and therefore, a ratio of the numbers of sheets is determined in accordance with the required specification of the motor.

Further, the electrodes 16a, 16b, 16c and 16d need not to be separate but even when they are shortcircuited as single ones of the electrodes, the ultrasonic motor 1 is operated with no problem.

Further, although the electrode 16e of the piezoelectric oscillator 11 is connected to the alternating current power source 6 via the switch 17a and the electrodes 16a, 16b, 16c and 16d are connected thereto via the switch 17b, the invention is not limited thereto but contrary to the embodiment, the electrodes 16a, 16b, 16c and 16d of the piezoelectric oscillator 11 may directly be connected to one side of the alternating current power source 6 and the electrode 16e may directly be connected thereto respectively without interposing switches, further, the electrode 16f and the electrode 16g of the piezoelectric oscillator 12 may be connected to the alternating current power source 6 via the switch 17a and the switch 17b.

Second Embodiment

An explanation will be given of an ultrasonic motor 2 according to a second embodiment of the invention.

Figure 6:
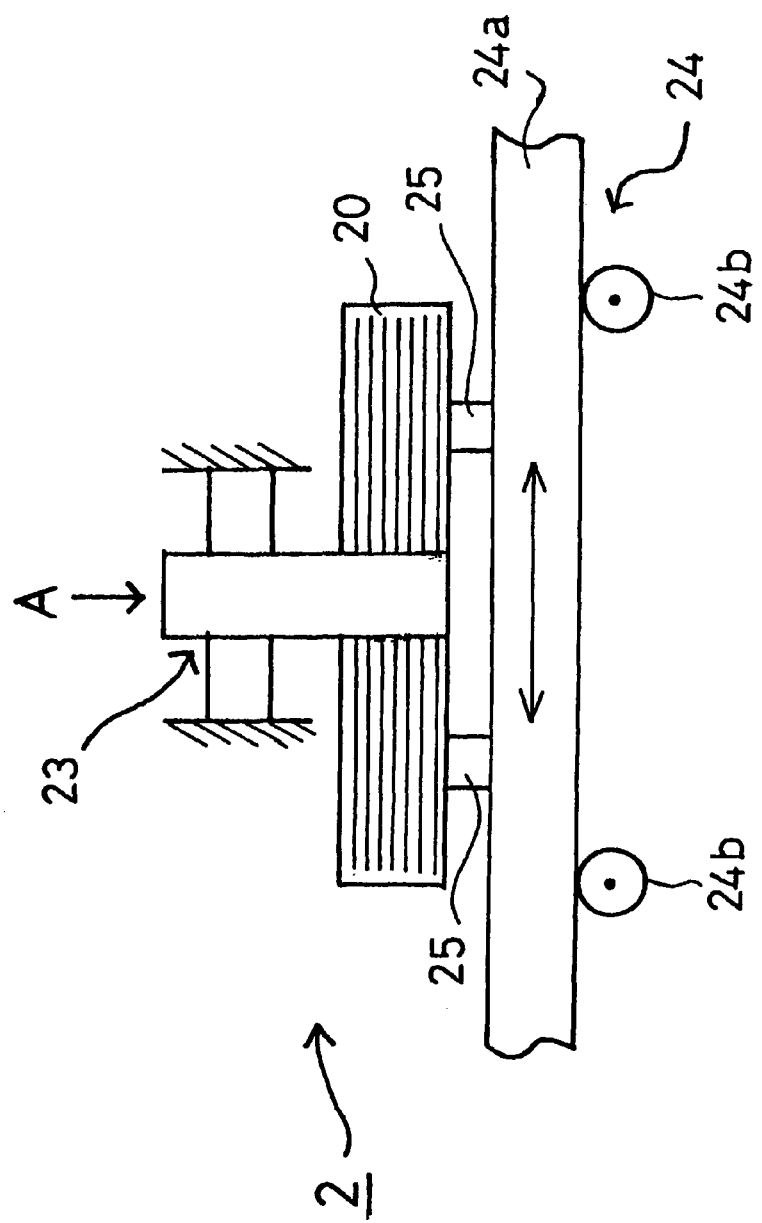
FIG. 6 is a view showing a constitution of an ultrasonic motor 2 according to a second embodiment of the invention.

As shown by a front view of FIG. 6, the ultrasonic motor 2 is constituted by a piezoelectric element 20, a supporting member 23 for supporting the piezoelectric element 20 and an object portion 24 including a moving body 24a which is brought into contact with an end face of the piezoelectric element 20 and moved by the piezoelectric element 20. That is, the ultrasonic motor 2 is a ultrasonic motor which moves the moving body 24a in a direction in parallel with the laminated layer faces of the piezoelectric element 20.

Further, the piezoelectric element 20 is pressed to the moving body 24a by a force from a pressing mechanism (illustration is omitted) having, for example, an elastic member of the like via the supporting member 23.

The piezoelectric element 20 is constructed by a structure in which, for example, respective four sheets of piezoelectric oscillators 21 (first piezoelectric oscillators) as a bending oscillation source and piezoelectric oscillators 22 (second piezoelectric oscillators) as an elongation and contraction vibration source overlap each other, further, the both are overlapped to laminate integrally, further, a lower face thereof is installed with projections 25 for driving the moving body 24a by being brought into contact therewith.

Further, the piezoelectric element 20 is provided with electrodes (illustration is omitted in FIG. 6), mentioned later. Further, according to the piezoelectric oscillators 21 and 22, for example, by interposing insulating members 28 (illustration is omitted), insulation among contiguous piezoelectric oscillators or electrodes is ensured.

Further, the projections 25 are respectively installed at portions in correspondence with antinodes of the bending vibration produced in the piezoelectric oscillator 21.

Here, an explanation will be given of polarized states of the piezoelectric oscillators 21 and the piezoelectric oscillators 22 and the structure of the electrodes of the piezoelectric element 20 in reference to FIGS. 7a, 7b, 7c, 7d, 7e and 7f.

Figure 7A:
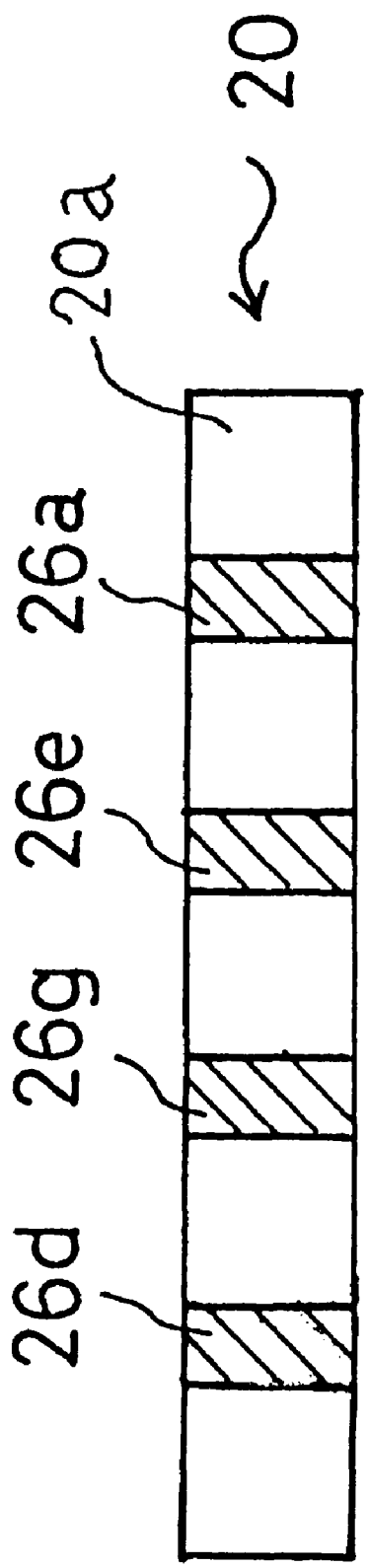
Figure 7C:
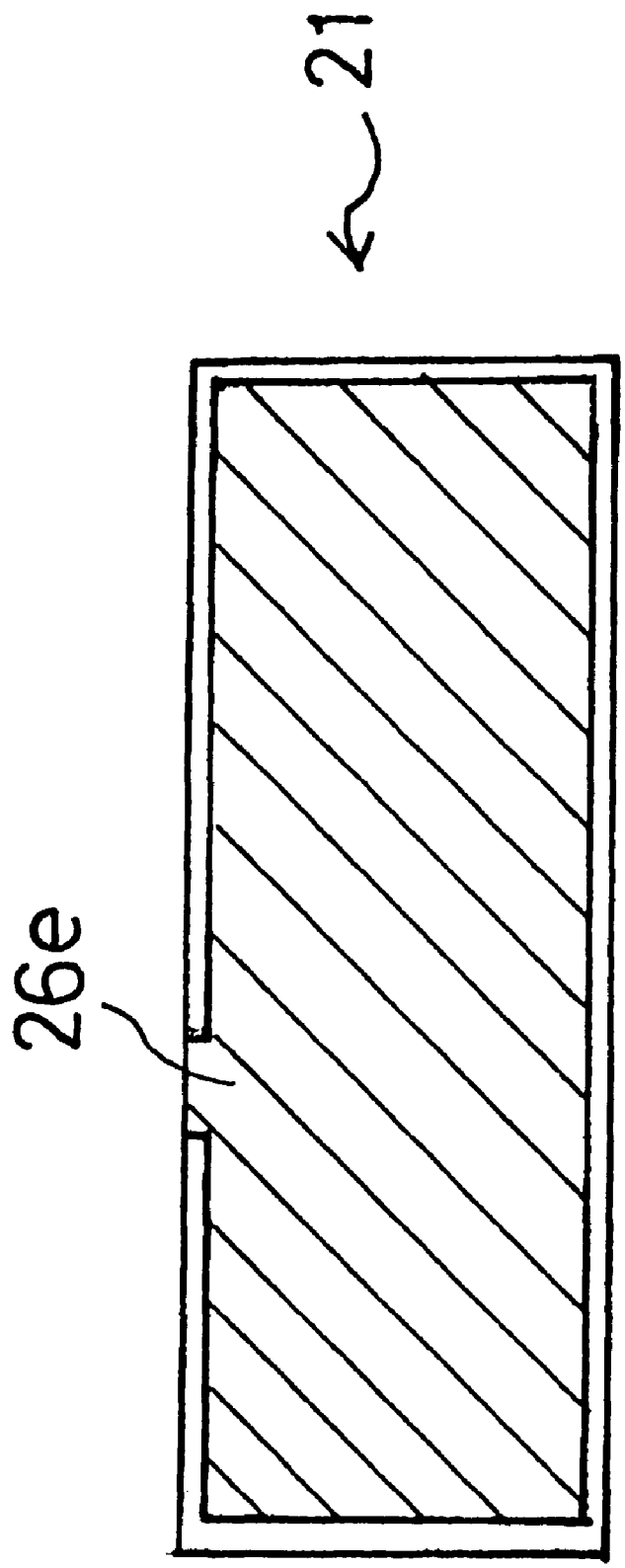
Figure 7F:
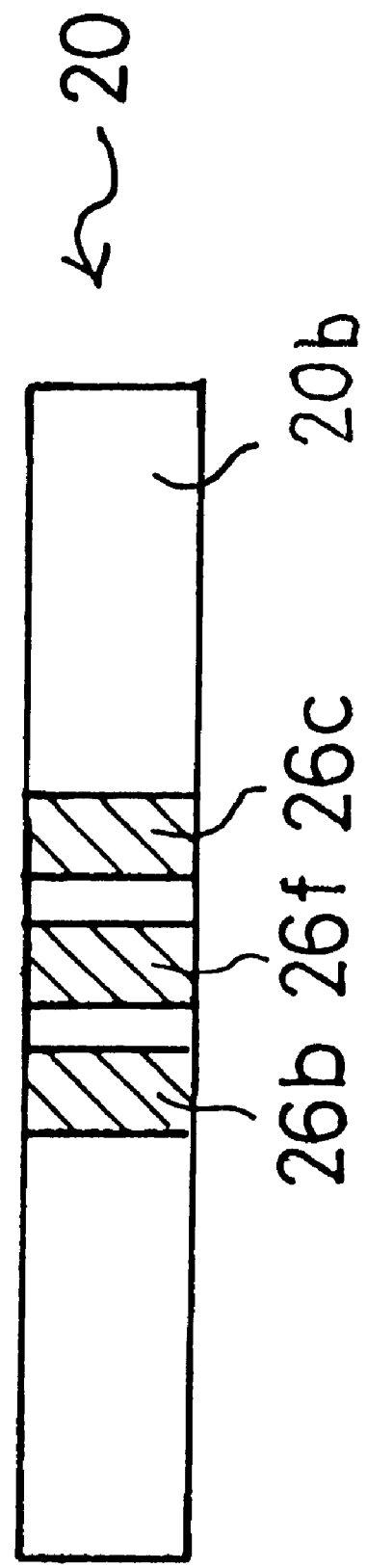

FIG. 7a is a view showing a side face 20a of the piezoelectric element 20 and FIG. 7f is a view showing a side face 20b disposed on a side opposed to the side face 20a. FIG. 7b is a view showing one face of the piezoelectric oscillator 21 and FIG. 7c is a view showing other face of the piezoelectric oscillator 21. Further, FIG. 7d is a view showing one face of the piezoelectric oscillator 22 and FIG. 7e is a view showing other face of the piezoelectric oscillator 22. Further, in the drawings, illustration of the projections 25 is omitted.

First, an explanation will be given of polarized states of the piezoelectric oscillator 21 and the piezoelectric oscillator 22.

The piezoelectric oscillator 21 is constructed by a structure in which as shown by FIG. 7b and FIG. 7c, four of a polarized region 21a, a polarized region 21b, a polarized region 21c and a polarized region 21d which are formed by being divided in four in the vertical direction, are polarized in a laminating direction, alternately reversely. That is, the polarized region 21a and the polarized region 21c are brought into a state in which, for example, upper faces thereof become plus and the polarized region 21b and the polarized region 21d are brought into a state in which, for example, upper faces thereof become minus.

Further, as shown by FIG. 7d and FIG. 7e, the piezoelectric oscillator 22 is polarized such that substantially an entire face thereof constitutes a single one of a polarized region and in the laminating direction, for example, an upper face thereof becomes plus.

Next, an explanation will be given of the structure of the electrodes of the piezoelectric element 20.

As shown by FIGS. 7a, 7b, 7c, 7d, 7e and 7f, the piezoelectric element 20 is provided with an electrode 26a, an electrode 26b, an electrode 26c, and electrode 26d, an electrode 26e, an electrode 26f and an electrode 26g.

Among them the electrodes 26a, 26b, 26c, 26d and 26e are electrodes for inputting signals to the piezoelectric oscillator 21 and the electrodes 26f and 26g are electrodes for inputting signals to the piezoelectric oscillator 22.

The electrode 26a substantially covers an upper face of the polarized region 21a of the piezoelectric oscillator 21 and a portion thereof is drawn to the side face 20a. That is, all of faces on one side of the polarized regions 21a of the four sheets of the piezoelectric oscillators 21 become the same potential by the electrode 26a continuous thereto via portions drawn to the side face 20a.

Similarly, the electrode 26b substantially covers one face of the polarized region 21b of the piezoelectric oscillator 21 and a portion thereof is drawn to the side face 20b. That is, all of faces on one side of the polarized regions 21b of four sheets of the piezoelectric oscillators 21 become the same potential by the electrode 26b continuous thereto via portions thereof drawn to the side face 20b.

Further, the electrode 26c substantially covers one face of the polarized region 21c of the piezoelectric oscillator 21 and a portion thereof is drawn to the side face 20b. That is, all of faces on one side of the polarized regions 21c of four sheets of the piezoelectric oscillators 21 become the same potential by the electrode 26c continuous thereto via portions thereof drawn to the side face 20b.

Similarly, the electrode 26d substantially covers one face of the polarized region 21d of the piezoelectric oscillator 21 and a portion thereof is drawn to the side face 20a. That is, all of faces on one side of the polarized regions 21d of four sheets of the piezoelectric oscillators 21 become the same potential by the electrode 26d continuous thereto via portions thereof drawn to the side face 20a.

Further, the electrode 26e covers all of lower faces of four of the polarized regions 21a, 21b, 21c and 21d of the piezoelectric oscillator 21 and a portion thereof is drawn to the side face 20a. That is, all of other faces of four of the polarized regions of four sheets of the piezoelectric oscillators 21 become the same potential by the electrode 26e continuous thereto via portions thereof drawn to the side face 20a.

Therefore, according to the piezoelectric oscillator 21, in the case in which the same drive signal is inputted to the electrodes 26a, 26b, 26c and 26d with the electrode 26e as the reference electrode, when the polarized regions 21a and 21c are elongated, the polarized regions 21b and 21d are contracted, further, when the polarized regions 21a and 21d are conversely contracted, the polarized regions 21b and 21c are elongated. Accordingly, the piezoelectric oscillator 21 carries out bending vibration in the thickness direction.

That is, the same drive signals are inputted to the same polarized regions and accordingly, all of four of the piezoelectric oscillators 21 carry out the bending vibration in the same direction. Accordingly, large bending vibration is produced in the piezoelectric element 20.

Further, the electrode 26f substantially covers one face of a polarized region 22a of the piezoelectric oscillator 22 and a portion thereof is drawn to the side face 20b. That is, all of faces on one side of the polarized regions 22a of four sheets of the piezoelectric oscillators 22 become the same potential by the electrode 26f continuous thereto via portions thereof drawn to the side face 20b.

Similarly, the electrode 26g substantially covers other face of the polarized region 22a of the piezoelectric oscillator 22 and a portion thereof is drawn to the side face 20a. That is, all of lower faces of the polarized region 22a of four sheets of the piezoelectric oscillators 22 become the same potential by the electrode 26g continuous thereto via portions thereof drawn to the side face 20a.

Therefore, according to the piezoelectric oscillator 22, when the drive signal is inputted to the electrode 26f with the electrode 26g as a reference, the polarized region 22a is elongated or contracted. Therefore, the piezoelectric oscillator 22 carries out elongation and contraction movement in the longitudinal direction. Accordingly, large elongation and contraction vibration is produced in the piezoelectric element 20.

That is, the same drive signals are inputted to the same polarized regions and accordingly, four sheets of the piezoelectric oscillators 22 carry out the same elongation and contraction vibration.

Further, fabrication procedure of the ultrasonic motor 2 is the same as the fabrication procedure of the ultrasonic motor 1.

An explanation will be given of operation of the ultrasonic motor 2 having the above-described structure in reference to FIGS. 8a, 8b, 8c and 8d and FIGS. 9a, 9b, 9c and 9d.

FIG. 8c and FIG. 9c are views showing a connecting structure of the ultrasonic motor 2 and the alternating current power source 6.

That is, according to the ultrasonic motor 2, the electrode 26e and the electrodes 26a, 26b, 26c and 26d of the piezoelectric oscillator 21 are respectively connected to the alternating current power source 6 via switches 27a and 27b (switching means). Further, the electrode 26f of the piezoelectric oscillator 22 is directly connected to the output side of the alternating current power source 6 and the electrode 26g thereof is directly connected to the reference potential side, respectively.

Therefore, the directions for connecting the electrodes 26a, 26b, 26c, 26d and 26e, that is, whether these electrodes are connected to the output side of the alternating current power source 6 or to the ground potential side, is switched by the switch 27a and the switch 27b.

Further, in FIGS. 8a, 8b, 8c and 8d and FIGS. 9a, 9b, 9c and 9d, constituent elements of the ultrasonic motor 2 other than the piezoelectric element 20 are omitted for convenience of explanation, further, the piezoelectric element 20 is constructed by a structure in which one sheet of the piezoelectric oscillator 21 and one sheet of the piezoelectric oscillator 22 are integrally laminated by interposing an insulating member 28.

First, an explanation will be given of operation of the ultrasonic motor 2 when the electrodes 26a, 26b, 26c and 26d are connected to the ground potential side and the electrode 26e is connected to the output side via the switch 27a and the switch 27b as shown by FIG. 8c, in reference to FIGS. 8a and 8b.

FIG. 8a shows a behavior of elongation and contraction vibration of the piezoelectric oscillator 22 and FIG. 8b shows a behavior of bending vibration of the piezoelectric oscillator 21 respectively by using sectional views and FIG. 8d shows a drive state of the ultrasonic motor 2 when viewed from a transverse direction.

When output potential of the alternating current power source 6 becomes higher than reference voltage, the polarized region 21a and the polarized region 21c of the piezoelectric oscillator 21 are elongated in the longitudinal direction and the polarized region 21b and the polarized region 21d are contracted in the longitudinal direction. Accordingly, the piezoelectric oscillator 21 is bent as shown by a hatched portion of FIG. 8b and predetermined portions of a lower face thereof are bent in directions designated by arrow marks Y.

At this occasion, as mentioned above, substantially an entire face of the piezoelectric oscillator 22 is polarized in a direction the same as that of the polarized region 21a and accordingly, the piezoelectric oscillator 22 is elongated in the longitudinal direction as shown by a hatched portion of FIG. 8a and a lower face thereof is elongated in directions designated by arrow marks X.

Further, when the output potential of the alternating current power source 6 becomes lower than the reference potential, predetermined portions of the lower face of the piezoelectric oscillator 21 are bent in directions of arrow marks Y' reverse to the arrow mark Y, further, the lower face of the piezoelectric oscillator 22 is contracted in directions 180 degree reverse to the arrow marks X.

Accordingly, the predetermined portions of the lower face of the piezoelectric oscillator 20 carry out an elliptic motion in directions designated by arrow marks Z of FIG. 8d, therefore, the ultrasonic motor 2 moves a moving body (illustration is omitted) which is brought into press contact with the end face in directions designated by the arrow marks Z.

Next, an explanation will be given of the operation of the ultrasonic motor 2 when as shown by FIG. 9c, contrary to FIG. 8, the electrodes 26a, 26b, 26c and 26d are connected to the output side and the electrode 26e is connected to the reference potential side in reference to FIGS. 9a, 9b and 9d.

FIG. 9a shows a behavior of elongation and contraction vibration of the piezoelectric oscillator 22 and FIG. 9c shows a behavior of bending vibration of the piezoelectric oscillator 21 respectively by using sectional views, further, FIG. 9d shows a drive state of the ultrasonic motor 2 when viewed from a transverse direction.

When the output potential of the alternating current power source 6 becomes higher than the reference potential, the polarized region 21a and the polarized region 21d of the piezoelectric oscillator 21 are contracted in the longitudinal direction and the polarized region 21b and the polarized region 21c are elongated in the longitudinal direction. Accordingly, the piezoelectric oscillator 21 is bent as shown by a hatched portion of FIG. 9b and predetermined portions of the lower face are bent in directions shown by arrow marks Y'.

At this occasion, as mentioned above, substantially an entire face of the piezoelectric oscillator 22 is polarized in a direction the same as that of the polarized region 21a and accordingly, as shown by a hatched portion of FIG. 9a, the piezoelectric oscillator 22 is elongated in the longitudinal direction and the end face is elongated in directions shown by arrow marks X.

Further, when the output potential of the alternating current power source 6 becomes lower than the reference potential, the predetermined portions of the lower face of the piezoelectric oscillator 21 are bent in a direction of arrow marks Y reverse to the arrow marks Y', further, the lower face of the piezoelectric oscillator 22 is contracted in directions 180 degree reverse to the arrow marks X.

Accordingly, the predetermined portions of the lower face of the piezoelectric element 20 carry out an elliptic motion in a direction shown by arrow marks Z' of FIG. 9d, and therefore, the ultrasonic motor 2 moves a moving member (illustration is omitted) which is brought into press contact with the end face in the direction shown by the arrow mark Z', that is, in the direction reverse to the arrow mark Z of FIG. 8d.

That is, according to the ultrasonic motor 2, the electrode 26e of the piezoelectric oscillator 21 is connected to the alternating current power source 6 via the switch 27a, the electrodes 26a, 26b, 26c and 26d are connected thereto via the switch 27b, respectively, and accordingly, the moving direction of the moving body 24a can be reversed simply by switching both of the switches 27a and 27b without providing a phase circuit for changing a phase of a signal.

In this way, according to the ultrasonic motor 2 of the second embodiment of the invention, the piezoelectric oscillators 22 as an elongation and contraction vibration source are integrally laminated on the piezoelectric oscillators 21 as a bending vibration source and therefore, for example, by separately setting and changing reference potential of the piezoelectric oscillator 21 and the reference potential of the piezoelectric oscillator 22, the elongation and contraction vibration and the bending vibration can separately be controlled.

Further, the bending vibration is carried out by inputting drive signals to all of the polarized regions 21a, 21b, 21c and 21d of the piezoelectric oscillator 21 and accordingly, output of the ultrasonic motor 2 is larger than that of the conventional ultrasonic motor.

Further, respective pluralities of the piezoelectric oscillators 21 and the piezoelectric oscillators 22 having thin thicknesses are used and accordingly, the piezoelectric oscillators can be driven by low voltage and the output is further magnified.

Further, the ultrasonic motor 2 is driven by a single one of an input signal and accordingly, a self-excited oscillation circuit can easily be constituted.

Further, when the electrode 26e of the piezoelectric oscillator 21 is connected to the alternating current power source 6 via the switch 27a and the electrodes 26a, 26b, 26c and 26d are connected thereto via the switch 27b, respectively, the ultrasonic motor 2 moves the moving body 24a in the reverse direction simply by switching both of the switches 27a and 27b.

Even when the piezoelectric oscillators 21 and 22 are applied with signals having different phases, the piezoelectric oscillators can naturally be driven.

Further, according to the piezoelectric element 20 of the embodiment, numbers of sheets of the piezoelectric oscillators 21 and 22 may arbitrarily be set and both need not to be the same.

Further, the electrodes 26a, 26b, 26c and 26d need not to be separate but even when the electrodes are shortcircuited into one constituent, the ultrasonic motor 2 is operated with no problem.

Further, although the electrode 26e of the piezoelectric oscillator 21 is connected to the alternating current power source 6 via the switch 27a and the electrodes 26a, 26b, 26c and 26d are connected thereto via the switch 27b, respectively, the invention is not limited thereto but, contrary to the embodiment, the electrodes 26a, 26b, 26c and 26d of the piezoelectric oscillator 21 may directly be connected to one side of the alternating current power source 6 and the electrode 26e may directly be connected to other side thereof respectively without interposing switches, further, the electrode 26f and the electrode 26g of the piezoelectric oscillator 22 may be connected to the alternating current power source 6 via the switch 27a and the switch 27b.

Third Embodiment

An explanation will be given of a third embodiment of the invention in reference to FIG. 10a through FIG. 11 as follows.

The third embodiment of the invention is basically the same as the first embodiment and the second embodiment and comprises piezoelectric oscillators 31 (first piezoelectric oscillators) as a bending vibration source and piezoelectric oscillators 32 (second piezoelectric oscillators) as an elongation and contraction vibration source. A point of difference therebetween resides in that the piezoelectric oscillator 18 constituting an insulating member is not provided and the piezoelectric oscillators 31 and the piezoelectric oscillators 32 are provided with common electrodes 36e.

An explanation will be given of polarized states and electrode structures based on a modified example of the first embodiment as follows.

FIG. 10a is a view showing a side face 30a of a piezoelectric element 30 and FIG. 10f is a view showing a side face 30b thereof. FIG. 10b is a top view of odd number ones of the piezoelectric oscillators 31 and a bottom view of even number ones thereof and FIG. 10c is a bottom view of the odd number ones of the piezoelectric oscillators 31 and a top view of even number ones thereof. Further, FIG. 10d is a top view of odd number ones of the piezoelectric oscillators 32 and a bottom view of even number ones thereof and FIG. 10e is a bottom view of the odd number ones of the piezoelectric oscillators 32 and a top view of even number ones thereof. That is, coupling faces of the respective piezoelectric oscillators constitute common electrodes.

First, an explanation will be given of polarized states of the piezoelectric oscillator 31 and the piezoelectric oscillator 32.

As shown by FIG. 10b and FIG. 10c, the piezoelectric oscillator 31 is constituted by a structure in which four of a polarized region 31a, a polarized region 31b, a polarized region 31c and a polarized region 31d produced by dividing the piezoelectric oscillator 31 in two in the longitudinal direction and dividing the piezoelectric oscillator 31 in two also in the transverse direction, are polarized alternately reversely in a laminating direction. That is, the polarized region 31a and the polarized region 31d are brought into a state in which, for example, upper faces thereof become plus and the polarized region 31b and the polarized region 31c are brought into a state in which, for example, upper face thereof become minus.

Further, as shown by FIG. 10d and FIG. 10e, substantially an entire face of the piezoelectric oscillator 32 constitutes a single one of the polarized region and the piezoelectric oscillator 32 is polarized in the laminating direction such that, for example, an upper face thereof becomes plus.

Next, an explanation will be given of the structures of electrodes of the piezoelectric element 30 in reference to FIGS. 10a, 10b, 10c, 10d, 10e and 10f as follows.

The piezoelectric element 30 is provided with an electrode 36a, an electrode 36b, an electrode 36c, an electrode 36d, an electrode 36e and an electrode 36f.

Among them, the electrodes 36a, 36b, 36c, 36d and 36e are electrodes for inputting signals to the piezoelectric oscillator 31 and the electrodes 36e and 36f are electrodes for inputting signals to the piezoelectric oscillator 32. Accordingly, the electrode 36e constitutes an electrically common portion of the piezoelectric oscillators 31 and the piezoelectric oscillators 32.

The electrode 36a substantially covers one face of the polarized region 31a of the piezoelectric oscillator 31 and a portion thereof is drawn to the side face 30a. That is, all of upper faces of the polarized regions 31a of four sheets of the piezoelectric oscillators 31 become the same potential by the electrode 36a continuous thereto via portions thereof drawn to the side face 30a.

Similarly, the electrode 36b substantially covers one face of the polarized region 31b of the piezoelectric oscillator 31 and a portion thereof is drawn to the side face 30a. That is, all of upper faces of the polarized regions 31b of four sheets of the piezoelectric oscillators 31 become the same potential by the electrode 36b continuous thereto via portions thereof drawn to the side face 30a.

Further, the electrode 36c substantially covers one face of the polarized region 31c of the piezoelectric oscillator 31 and a portion thereof is drawn to the side face 30b. That is, all of faces on one side of the polarized regions 31c of four sheets of the piezoelectric oscillators 31 become the same potential by the electrode 36c continuous thereto via portions thereof drawn to the side face 30b.

Similarly, the electrode 36d substantially covers one face of the polarized region 31d of the piezoelectric oscillator 31 and a portion thereof is drawn to the side face 30b. That is, all of faces on one side of the polarized regions 31d of four sheets of the piezoelectric oscillators 31 become the same potential by the electrode 36d continuous thereto via portions thereof drawn to the side face 30b.

Further, the electrode 36e covers other faces of four of the polarized regions 31a, 31b, 31c and 31d of the piezoelectric oscillator 31 and other face of a polarized region 32a of the piezoelectric oscillator 32 and portions thereof are drawn to the side face 30a. That is, all of the other faces of four of the polarized regions of four sheets of the piezoelectric oscillators 31 and faces on one side of four sheets of the piezoelectric oscillators 32 become the same potential by the electrode 36e continuous thereto via portions thereof drawn to the side face 30a.

Further, according to the piezoelectric oscillator 31, in the case in which the same drive signal is inputted to the electrodes 36a, 36b, 36c and 36d with the electrode 36e as a reference electrode, when the polarized regions 31a and 31d are elongated, the polarized regions 31b and 31c are contracted, further, when the polarized regions 31a and 31d are conversely contracted, the polarized regions 31b and 31c are elongated. Accordingly, the piezoelectric oscillator 31 carries out bending vibration in the transverse direction.

That is, the same drive signals are inputted to the same polarized regions and accordingly, all of four of the piezoelectric oscillators 31 carry out the bending vibration in the same direction. Further, the piezoelectric oscillators 31 are laminated in a direction orthogonal to a displacement direction and therefore, strains to which four of the piezoelectric oscillators contribute are the same. Accordingly, the large bending oscillation is produced in the piezoelectric element 30. Further, only bending vibration is excited in the piezoelectric oscillator 31 different from the conventional examples shown by FIGS. 13a and 13b.

Further, the electrode 36f substantially covers an upper face of the polarized region 32a of the piezoelectric oscillator 32 and a portion thereof is drawn to the side face 30b. That is, all of upper faces of the polarized regions 32a of four sheets of the piezoelectric oscillators 32 become the same potential by the electrode 36f continuous thereto via portions thereof drawn to the side face 30b.

Further, according to the piezoelectric oscillator 32, when a drive signal is inputted to the electrode 36f with the electrode 36e as a reference, the polarized region 32a is elongated or contracted and accordingly, the piezoelectric oscillator 32 carries out elongation and contraction movement in the longitudinal direction.

That is, the same drive signals are inputted to the same polarized regions and accordingly, four sheets of the piezoelectric oscillators 32 carry out the same elongation and contraction vibration. Therefore, large elongation and contraction vibration is produced in the piezoelectric element 30.

An explanation will be given of operation of the ultrasonic motor 3 having the above-described structure in reference to FIG. 11.

FIG. 11 is a view showing a connecting structure of the ultrasonic motor 3 and the alternating current power source (signal source) 6.

That is, according to the ultrasonic motor 3, the electrodes 36a, 36b, 36c and 36d of the piezoelectric oscillator 31 are respectively connected to the alternating current power source 6 via a phase inverter circuit 19. Further, the electrode 36f of the piezoelectric oscillator 32 is directly connected to the output side of the alternating current power source 6 and the electrode 36e is directly connected to a reference potential side thereof, respectively. Therefore, a phase of a signal inputted to the electrodes 36a, 36b, 36c and 36d is changed by the phase inverter circuit 19 relative to the electrode 36f.

Further, in FIG. 11, constituent elements of the ultrasonic motor 3 other than the piezoelectric element 30 are omitted for convenience of explanation, further, in this case, for convenience of explanation, the piezoelectric element 30 is constructed by a structure in which one sheet of the piezoelectric oscillator 31 and one sheet of the piezoelectric oscillator 32 are integrally laminated.

When the phase of the signal from the alternating current power source 6 is not inverted by the phase inverter circuit 19, the ultrasonic motor 3 shows a drive state similar to that in FIGS. 4a, 4b, 4c and 4d.

That is, when the output potential of the alternating current power source 6 becomes higher than the reference potential, the polarized region 31a and the polarized region 31d of the piezoelectric oscillator 31 are elongated in the longitudinal direction and the polarized region 31b and the polarized region 31c are contracted in the longitudinal direction. Accordingly, the piezoelectric oscillator 31 is bent as shown by the void portions of FIG. 4c and the end face is inclined in the direction designated by the arrow mark Y.

At this occasion, as mentioned above, almost entire face of the piezoelectric oscillator 32 is polarized in the direction the same as that of the polarized region 31a and accordingly, the piezoelectric oscillator 32 is elongated in the longitudinal direction as shown by the void portions of FIG. 4a and the end face is elongated in the direction shown by the arrow mark X.

Further, when the output potential of the alternating current power source 6 becomes lower than the reference potential, the end face of the piezoelectric oscillator 31 is inclined in the direction of the arrow mark Y' reverse to the arrow mark Y, further, the end face of the piezoelectric oscillator 32 is contracted in the direction 180 degree reverse to the arrow mark X.

That is, the bending vibration produced in the piezoelectric oscillator 31 and the elongation and contraction vibration produced in the piezoelectric oscillator 32 are synthesized, as a result, the end face of the piezoelectric element 30 carries out the elliptic motion in the direction shown by the arrow mark Z of FIG. 4d, accordingly, the ultrasonic motor 3 moves a moving body (illustration is omitted) which is brought into press contact with the end face in the direction designated by the arrow mark Z.

Next, when the phase of the signal from the alternating current power source 6 is inverted by 180 degree by the phase inverter circuit 19, there is brought about a drive state similar to that in FIG. 5b.

When the output potential of the alternating current power source 6 becomes higher than the reference potential, the polarized region 31a and the polarized region 31d of the piezoelectric oscillator 31 are contracted in the longitudinal direction and the polarized region 31b and the polarized region 31c are elongated in the longitudinal direction. Accordingly, the piezoelectric oscillator 31 is bent as shown by the void portions of FIG. 5c and the end face is inclined in the direction designated by the arrow mark Y'.

At this occasion, as mentioned above, substantially an entire face of the piezoelectric oscillator 32 is polarized in the direction the same as that of the polarized region 31a and therefore, the piezoelectric oscillator 32 is elongated in the longitudinal direction as shown by the void portions of FIG. 5a and the end face is elongated in the direction designated by the arrow mark X.

Further, when the output potential of the alternating current power source 6 becomes lower than the reference potential, the end face of the piezoelectric oscillator 31 is inclined in the direction of the arrow mark Y reverse to the arrow mark Y', further, the end face of the piezoelectric oscillator 32 is contracted in the direction 180 degree reverse to the arrow mark X.

Therefore, the end face of the piezoelectric element 30 carries out the elliptic motion in the direction shown by the arrow mark Z, of FIG. 5d, accordingly, the ultrasonic motor 3 moves the moving body (illustration is omitted) which is brought into press contact with the end face in the direction designated by the arrow mark Z', that is, the direction reverse to the arrow mark Z of FIG. 4d.

That is, the electrodes 36a, 36b, 36c and 36d of the piezoelectric oscillator 31 of the ultrasonic motor 3 are connected to the alternating current power source 6 via the phase inverter circuit 19 and accordingly, the direction in which the ultrasonic motor 3 moves the moving body 34a can be reversed simply by selecting whether the phase of the signal from the alternating current power source 6 is inverted.

In this way, according to the ultrasonic motor 3 of the third embodiment of the invention, the piezoelectric oscillators 32 as the elongation and contraction vibration source are integrally laminated on the piezoelectric oscillators 31 as the bending vibration source and accordingly, the elongation and contraction vibration and the bending vibration can separately be controlled by, for example, separately setting and changing the input signal to the piezoelectric oscillators 31 and the input signal to the piezoelectric oscillators 32.

Further, the bending vibration is carried out by inputting the drive signal from the alternating current power source 6 to all of the polarized regions 31a, 31b, 31c and 31d of the piezoelectric oscillator 31 and accordingly, only the bending vibration is excited and further, a drive force thereof is large and output of the ultrasonic motor 3 is larger than that of the conventional ultrasonic motor.

Further, respective pluralities of the piezoelectric oscillators 31 and the piezoelectric oscillators 32 are used and accordingly, the output is further magnified.

Further, the ultrasonic motor 3 is driven by a single one of an input signal and accordingly, the constitution of the self-excited oscillation circuit is simplified and therefore, self-excited oscillation control is facilitated.

Further, the ultrasonic motor 3 can switch the moving direction of the moving body 14a simply by selecting whether a phase of a signal is inverted by the phase inverter circuit 19.

The piezoelectric oscillators 31 and 32 can naturally be driven even when the piezoelectric oscillators 31 and 32 are applied with signals having different phases, for example, signals of 90 degree or −90 degree.

Further, although according to the piezoelectric element 30 of the embodiment, four sheets of the piezoelectric oscillators 31 are integrally laminated, on top thereof, four sheets of the piezoelectric oscillators 32 are integrally laminated, the invention is not limited thereto but the piezoelectric element 30 may be constructed by a structure in which the piezoelectric oscillators 31 and the piezoelectric oscillators 32 are laminated alternately integrally. Further, numbers of sheets of the piezoelectric oscillators 31 and 32 may naturally be set arbitrarily and both need not to be the same. Particularly, by making the both different from each other, two of vibrational forces can independently be controlled and accordingly, a ratio of numbers of sheets is set in accordance with required specification of a motor.

Further, the electrodes 36a, 36b, 36c and 36d need not to be separate and even when the electrodes are shortcircuited into one electrode, the ultrasonic motor 3 is operated with no problem.

Further, although the electrodes 36a, 36b, 36c and 36d of the piezoelectric oscillator 31 are connected to the alternating current power source 6 via the phase inverter circuit 19, the invention is not limited thereto but contrary to the embodiment, the electrodes 36*a*, 36*b*, 36*c* and 36*d* of the piezoelectric oscillator 31 may directly be connected to one side of the alternating current power source 6 without interposing the phase inverter circuit 19, further, the electrode 36*f* of the piezoelectric oscillator 32 may be connected to the alternating current power source 6 via the phase inverter circuit 19.

Although a drive circuit of the embodiment becomes more complicated than those of the first embodiment and the second embodiment by an amount of adding the phase inverter circuit 19, the piezoelectric oscillators 31 and 32 contributing to drive operation can be installed at a space the same as that of the piezoelectric oscillator 18 constituting the insulating member and therefore, further downsizing and high output formation can be achieved.

Further, in comparison with the case in which a signal the phase of which is shifted by 90 degree or –90 degree is produced as shown by the conventional example, the signal is simply inverted and accordingly, the circuit constitution is simplified and the self-excited oscillation circuit is also easy to constitute.

Fourth Embodiment

FIG. 12 is a block diagram of an electronic apparatus 6 having an ultrasonic motor in which the ultrasonic motor according to the invention is applied to the electronic apparatus.

The electronic apparatus 6 having a ultrasonic motor is realized by providing a piezoelectric element 31 subjected to predetermined polarizing treatment, an oscillator 32 coupled to the piezoelectric element 31, a moving member 33 moved by the oscillator 32, a pressing mechanism 34 for pressing the oscillator 32 and the moving body 33, a transmission mechanism 35 moved in cooperation with the moving body 33 and an output mechanism 36 moved based on the operation of the transmission mechanism 35.

In this case, as the piezoelectric oscillator 31, the piezoelectric element 10 or the piezoelectric element 20 is used. Further, the switches 17*a* and 17*b* or the switches 27*a* and 27*b* are installed pertinently between the piezoelectric element and an alternating current power source (illustration is omitted).

Further, as the transmission mechanism 35, for example, a transmission wheel of a gear, a friction wheel or the like is used. As the output mechanism 36, for example, there is used a shutter drive mechanism or a lens drive mechanism in a camera, an indicating hand drive mechanism or a calendar drive mechanism in an electronic timepiece, when used in a storage apparatus, a head drive mechanism for driving a head reading and writing information to and from a storage medium in the information storage apparatus, a tool feed mechanism or a working member feed mechanism in a machine tool or the like.

Further, as the electronic apparatus 6 having a ultrasonic motor, for example, there is pointed out an electronic timepiece, a measuring instrument, a camera, a printer, a printing machine, a machine tool, a robot, a moving apparatus, a storage apparatus or the like.

The electronic apparatus 6 having a ultrasonic motor uses a ultrasonic motor which is smaller than the conventional ultrasonic motor and is provided with larger output than the conventional ultrasonic motor and in which self-excited oscillation drive having simple circuit constitution is used in driving operation and accordingly, the size of the ultrasonic motor and its peripheral circuit are downsized and therefore, the electronic apparatus 6 having the ultrasonic motor is more downsized than the conventional electronic apparatus.

Further, by constituting to laminate a plurality of piezoelectric oscillators each having a thin thickness, the electronic apparatus 6 having the ultrasonic motor can be driven by low voltage and can directly be driven by a battery power source.

Further, by constructing a constitution in which an output shaft is attached to the moving body 3 and a power transmission mechanism for transmitting torque from the output shaft is installed, the drive mechanism is constituted by a single member of a ultrasonic motor.

According to the invention, in respect of the first piezoelectric oscillators, the first polarized regions polarized in the same polarities and the second polarized regions polarized in polarities reverse to those of the first polarized regions, are arranged alternately substantially over entire face thereof and drive signals having the same phase are inputted to the plurality of polarized regions and accordingly, large bending vibration is produced. Further, in the second piezoelectric oscillators as the elongation and contraction vibration source installed separately from the first piezoelectric oscillators, large elongation and contraction vibration is produced. Further, the first piezoelectric oscillators and the second piezoelectric oscillators are integrally formed and accordingly, the bending vibration and the elongation and contraction vibration are synthesized without leakage. Accordingly, an ultrasonic motor having large output can be fabricated.

Further, in the case of a ultrasonic motor having an output the same as that of a conventional ultrasonic motor, the ultrasonic motor is downsized.

Further, by separately controlling the first piezoelectric oscillators and the second piezoelectric oscillators, elongation and contraction vibration and bending vibration can separately be controlled.

Further, the ultrasonic motor is driven by a single one of an input signal and accordingly, the self-excited oscillation circuit is simplified, therefore, self-excited oscillation control is facilitated.

Further, according to the invention, other than achieving an effect similar to that in the above-described aspect of the invention, respective pluralities of the first piezoelectric oscillators and the second piezoelectric oscillators are used and accordingly, the output is further magnified.

Further, according to the invention, the same signal source is used as the signal source having the same phase and accordingly, a peripheral circuit of the ultrasonic motor is simplified.

Further, according to the invention, either of the first piezoelectric oscillators and the second piezoelectric oscillators is connected to the signal source via switching means for inverting a phase of a signal and accordingly, by only switching the switching means, an input signal to either of the first piezoelectric oscillators and the second piezoelectric oscillators is inverted and accordingly, the drive direction of the ultrasonic motor is reversed.

Further, according to the invention, the drive direction of the ultrasonic motor can directly be controlled by using switching elements and accordingly, the constitution of the drive circuit is simplified.

Further, according to the invention, the above-described ultrasonic motor having an output larger than that of the conventional ultrasonic motor is used and accordingly, the size of the ultrasonic motor and its peripheral circuit are downsized, therefore, the electronic apparatus having the ultrasonic motor is downsized.

Further, when self-excited oscillation control is used as the control method of the ultrasonic motor, a positioning accuracy of a movable portion of the electronic apparatus having the ultrasonic motor is promoted, further, downsizing of the electronic apparatus can be realized.

What is claimed is:

1. An ultrasonic motor comprising: first piezoelectric oscillators alternately arranged with first polarized regions having a first direction of polarization and second polarized regions having a second direction of polarization opposite to the first direction of polarization, the first piezoelectric oscillators undergoing bending vibration in a first direction by inputting drive signals having a same phase to the first polarized regions and the second polarized regions to thereby excite the first polarized regions and the second polarized regions; and second piezoelectric oscillators laminated to the first piezoelectric oscillators in a second direction generally perpendicular to the first direction for undergoing elongation and contraction vibration in the first direction; wherein when a driving signal is applied to the first and second piezoelectric oscillators, a drive force is generated by a combination of the bending vibration of the first piezoelectric oscillators and the elongation and contraction vibration of the second piezoelectric oscillators.

2. An ultrasonic motor according to claim 1; wherein the polarized regions of each of the first piezoelectric oscillators are arranged in two rows along one direction.

3. An ultrasonic motor according to claim 1; wherein the polarized regions of each of the first piezoelectric oscillators are arranged in one row along one direction.

4. An ultrasonic motor according to claim 1; wherein the first piezoelectric oscillators are integrally laminated to the second piezoelectric oscillators.

5. An ultrasonic motor according to claim 1; further comprising a single signal generating source for generating drive signals having the same chase to vibrationally drive the first piezoelectric oscillators and the second piezoelectric oscillators to undergo bending vibration and elongation and contraction vibration, respectively.

6. An ultrasonic motor according to claim 5; further comprising switching means for connecting one of the first piezoelectric oscillators and the second piezoelectric oscillators to the signal generating source and for inverting the phase of the drive signals generated by the signal generating source.

7. In an electronic apparatus having an output mechanism for producing an output motion, an ultrasonic motor according to claim 1 for driving the output mechanism.

8. An ultrasonic motor comprising: first piezoelectric oscillators alternately arranged with first polarized regions having a first direction of polarization and second polarized regions having a second direction of polarization opposite to the first direction of polarization, the first piezoelectric oscillators undergoing bending vibration generated by inputting drive signals having a same phase to the first polarized regions and the second polarized regions to thereby excite the first and second polarized regions; and second piezoelectric oscillators laminated to the first piezoelectric oscillators for undergoing elongation and contraction vibration, the second piezoelectric oscillators being driven independently from and not electrically connected to the first piezoelectric oscillators; wherein when a driving signal is applied to the first and second piezoelectric oscillators, a drive force is generated by a combination of the bending vibration of the first piezoelectric oscillators and the elongation and contraction vibration of the second piezoelectric oscillators.

9. An ultrasonic motor according to claim 8; wherein the polarized regions of each of the first piezoelectric oscillators are arranged in two rows along one direction.

10. An ultrasonic motor according to claim 8; wherein the polarized regions of each of the first piezoelectric oscillators are arranged in one row along one direction.

11. An ultrasonic motor according to claim 8; wherein the first piezoelectric oscillators are integrally laminated to the second piezoelectric oscillators.

12. In an electronic apparatus having an output mechanism for producing an output motion, an ultrasonic motor according to claim 8 for driving the output mechanism.

13. An ultrasonic motor comprising:

at least one first piezoelectric oscillator for undergoing bending vibration, the first piezoelectric oscillator having first polarized regions having a first direction of polarization and second polarized regions having a second direction of polarization opposite to the first direction of polarization;

at least one second piezoelectric oscillator laminated in a lamination direction to the first piezoelectric oscillator for undergoing elongation and contraction vibration in a direction generally perpendicular to the lamination direction;

a movable member connected to the first and second piezoelectric oscillators to be frictionally driven by a combination of the bending vibration of the first piezoelectric oscillator and the elongation and contraction vibration of the second piezoelectric oscillator; and driving means for generating a voltage signal to vibrationally drive the first and second piezoelectric oscillators to undergo bending vibration and elongation and contraction vibration, respectively.

14. An ultrasonic motor according to claim 13; wherein the first piezoelectric oscillator undergoes bending vibration in a direction generally perpendicular to the lamination direction.

15. An ultrasonic motor according to claim 13; wherein the polarized regions of each of the first piezoelectric oscillators are arranged in two rows along one direction.

16. An ultrasonic motor according to claim 13; wherein the polarized regions of each of the first piezoelectric oscillators are arranged in one row along one direction.

17. An ultrasonic motor according to claim 13; wherein the first piezoelectric oscillators are integrally laminated to the second piezoelectric oscillators.

18. In an electronic apparatus having an output mechanism for producing an output motion, an ultrasonic motor according to claim 13 for driving the output mechanism.

* * * * *